(12) United States Patent
Yamazaki et al.

(10) Patent No.: US 6,420,759 B2
(45) Date of Patent: Jul. 16, 2002

(54) SEMICONDUCTOR DEVICE

(75) Inventors: Shunpei Yamazaki, Tokyo; Takeshi Fukunaga, Kanagawa, both of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/752,976

(22) Filed: Dec. 28, 2000

Related U.S. Application Data

(63) Continuation of application No. 09/109,322, filed on Jul. 2, 1998, now Pat. No. 6,184,556.

(30) Foreign Application Priority Data

Jul. 4, 1997 (JP) ............................................... 9-194974

(51) Int. Cl.$^7$ .......................... H01L 27/01; H01L 27/12
(52) U.S. Cl. ....................... 257/354; 257/219; 257/221; 257/347; 438/149
(58) Field of Search ................. 257/219, 221, 257/347, 354; 438/149

(56) References Cited

U.S. PATENT DOCUMENTS

| | | | | |
|---|---|---|---|---|
| 4,454,524 A | * | 6/1984 | Spence | 357/23 |
| 5,210,437 A | * | 5/1993 | Sawada et al. | 257/392 |
| 5,343,051 A | * | 8/1994 | Yamaguchi et al. | 257/66 |
| H1435 H | * | 5/1995 | Cherne et al. | 257/347 |
| 5,619,053 A | * | 4/1997 | Iwamatsu et al. | 257/347 |
| 5,641,696 A | * | 6/1997 | Takeuchi | 438/257 |
| 5,753,958 A | * | 5/1998 | Burr et al. | 257/345 |
| 5,894,151 A | * | 4/1999 | Yamazaki et al. | 257/347 |

FOREIGN PATENT DOCUMENTS

WO  WO 88/03328 A1  5/1988

* cited by examiner

*Primary Examiner*—Allan R. Wilson
(74) *Attorney, Agent, or Firm*—Fish & Richardson P.C.

(57) ABSTRACT

There is provided a semiconductor device having a new structure which allows a high reliability and a high field effect mobility to be realized in the same time. In an insulated gate transistor having an SOI structure utilizing a mono-crystal semiconductor thin film on an insulating layer, pinning regions are formed at edge portions of a channel forming region. The pinning regions suppress a depletion layer from spreading from the drain side and prevent a short-channel effect. In the same time, they also function as a path for drawing out minority carriers generated by impact ionization to the outside and prevent a substrate floating effect from occurring.

24 Claims, 13 Drawing Sheets

Fig. 8A
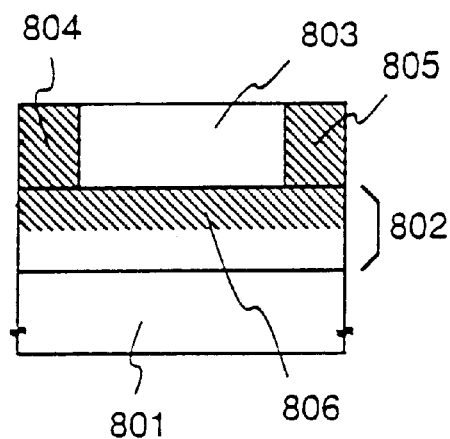
Fig. 8B
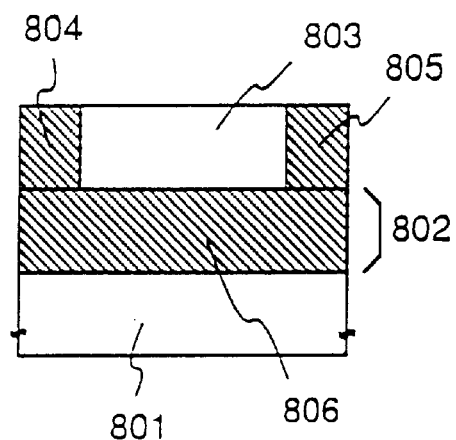
Fig. 8C
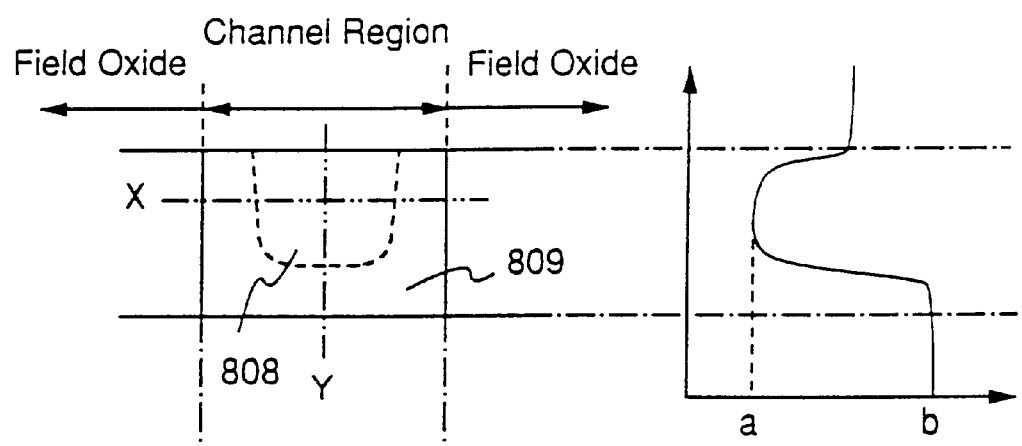
Fig. 8E
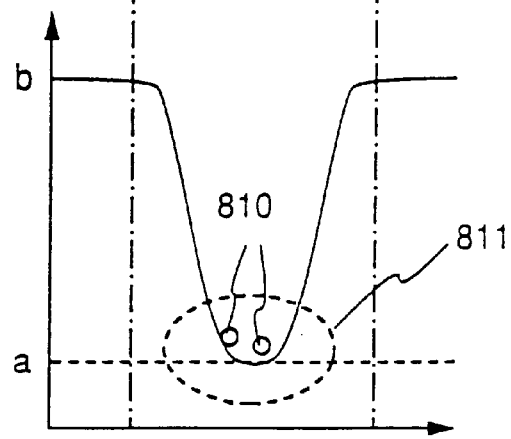
Fig. 8D

SEMICONDUCTOR DEVICE

This is a continuation of U.S. application Ser. No. 09/109,322, filed Jul. 2, 1998 now U.S. Pat. No. 6,184,556.

BACKGROUND OF THE INVENTION

1. Field of the Invention

The present invention disclosed in the present specification relates to a semiconductor device having an SOI (Silicon-On-Insulator) structure and more particularly to a structure of an insulated gate field effect transistor having the SOI structure (called as an SOI-MOSFET or an SOI-IGFET).

The technology of the present invention exhibits its effect in fabricating a submicron device whose channel length or channel width is less than 1 $\mu$m (typically 30 to 500 nm).

The present invention is applicable to various semiconductor integrated circuits such as IC, VLSI and ULSI constructed by integrating the MOSFETs having the SOI structure (hereinafter referred to as an SOIFET).

2. Description of Related Art

An SOIFET is now attracting attention as a semiconductor device replacing a MOSFET using bulk mono-crystal silicon. The SOIFET is characterized in that it is advantageous over the MOSFET in terms of high-speed operability and lower power consumption.

Then, while the research and development on VLSI, ULSI and the like using the SOIFET are actively conducted, there is a steady tendency of sub-micronizing the device size to enhance the integration of integrated circuits.

As for a channel length (L), it has now come to be required a work size in a deep sub-micron range of less than 0.2 $\mu$m or 0.1 $\mu$m. Similarly to that, a work size of less than 0.2 $\mu$m is required for a gate width (W) and a device size of L:W=1:1 has come to be proposed.

In the field of MOSFETs, there has been known a phenomenon called a short-channel effect as a factor of hindering the sub-micronization. The short-channel effect is an effect which causes various problems such as a drop of a withstand voltage between a source and a drain and a drop of a threshold voltage when the channel length is shortened (see "Submicron Device I" Mitsumasa Koyanagi and others, pp. 88 through 138, Maruzen Co., Ltd.).

According to the reference book, a punch-through phenomenon is known the most as one of causes of the drop of the withstand voltage. This phenomenon makes it difficult to control carriers by gate voltage as a potential influence of a depletion layer on the drain side extends to the source side and a diffusion potential of the source side is lowered when the channel length is shortened (drain-inducted barrier lowering phenomenon).

Such short-channel effect poses a similar problem also in the SOIFET, which must be overcome in forwarding the sub-micronization. Here, a mechanism how the short-channel effect occurs in the SOIFET (partial depletion type) will be explained with reference to schematic diagrams of FIGS. 3A through 3C.

As shown in FIG. 3A, the SOIFET comprises a mono-crystal silicon substrate 301, a buried oxide film 302, a field oxide film 303 for insulating a mono-crystal silicon layer on the oxide film 302, a source region 304, a drain region 305 and a channel forming region 306. The source and drain regions are formed by doping an impurity element to the mono-crystal silicon layer. The SOIFET further comprises a gate insulating film 307 and a gate electrode 308.

FIG. 3B is a schematic diagram drawn focusing on the channel forming region 306 in FIG. 3A. It is noted that the hatched portion 309 in FIG. 3B is a depletion layer spreading within the channel forming region.

Normally (when a channel length L is long), a depletion layer having an equal depth is formed under the channel formed right under the gate electrode 308. However, when the channel length (L) is shortened to the extreme, the depletion layer extended from the drain side spreads in the direction of the source region and contacts with the depletion layer of the source side in the end (FIG. 3B).

As a result, a potential barrier in the vicinity of the source is lowered by the drain voltage and a current flows by itself even when no voltage is applied to the gate electrode. In this case, an energy band between the source and the drain changes continuously as shown in FIG. 3C. This is the punch-through effect which lowers the withstand voltage between the source and the drain.

While various countermeasures have been taken to the short-channel effect described above, a measure which has been taken most in general is channel-doping. The channel-doping is a technique for suppressing the short-channel effect by doping a trace amount of impurity element such as P (phosphorus) and B (boron) shallowly over the whole channel forming region (as disclosed in Japanese Patent Laid Open Nos. Hei. 4-206971, 4-286339 and others).

However, the channel-doping technique has a drawback that it restricts the field effect mobility (hereinafter referred to simply as a mobility) of the MOSFET significantly. That is, the move of carriers is hampered by the impurity intentionally doped, thus dropping the mobility.

Further, there has been known a substrate floating effect (called also as a kink phenomenon) caused by impact ionization of implanted carriers as a cause of the drop of the withstand voltage between the source and the drain in the SOI structure. This will be explained below by exemplifying an N-cannel type SOIFET.

Electrons (major carriers) which have been attracted by a strong electric field and put into the high energy state in the vicinity of the drain collide with silicon lattice and generate a large amount of pairs of electron and positive hole (impact ionization phenomenon). The positive holes (minority carriers) generated at this time are pushed back by the drain electric field and are accumulated under the channel.

The positive holes accumulated under the channel boost the potential in the channel part, so that the source, the channel and the drain turn out to be an emitter, a base and a collector, respectively, thus turning on a parasitic bipolar transistor.

Thus, a through current flows between the source and the drain, causing a breakdown phenomenon of the withstand voltage between the source and the drain. While such phenomenon has been known also in the MOSFET using the bulk mono-crystal as a carrier implantation induced breakdown phenomenon, it poses a more serious problem in the SOI structure in which the substrate potential is floating

SUMMARY OF THE INVENTION

In view of the above-mentioned problems, it is an object of the present invention to provide a semiconductor device having a totally new structure which allows the high reliability and the high field mobility to be realized in the same time.

A scheme of the invention disclosed in the present specification is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein impurity regions which shift an energy band of the channel forming region are provided intentionally and locally only at edges of the channel forming region contacting with the field oxide film.

Another scheme of the invention is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein impurity regions which shift an energy band of the channel forming region are provided intentionally and locally only at edges of the channel forming region contacting with the field oxide film and the impurity regions suppress a depletion layer from spreading from the drain region to the source region.

A still other scheme of the invention is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein impurity regions which shift an energy band of the channel forming region are provided intentionally and locally only at edges of the channel forming region contacting with the field oxide film; and the impurity regions suppress a depletion layer from spreading from the drain region to the source region and draw out minority carriers generated by impact ionization in the vicinity of the drain region to the outside of the channel forming region.

Another scheme of invention is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein impurity regions which shift an energy band of the channel forming region are provided intentionally and locally only at edges of the channel forming region contacting with the field oxide film; and the impurity regions reach the inside of the source region/drain region.

The gist of the present invention is to form the impurity regions intentionally at the edges of the channel forming region (the edges contacting with the field oxide film, not edges contacting with the source and drain regions) to suppress the depletion layer from spreading from the drain side to the source side by the impurity regions.

It is noted that the inventors have defined a word "pinning" in the sense of "suppressing" because the effect of suppressing the depletion layer may be seen as if pinning the depletion layer. Then, the FET utilizing the invention disclosed in the present specification will be called a pinning FET to clearly distinguish from the conventional MOSFETs.

A different scheme of the invention is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein first impurity regions which shift an energy band of the channel forming region are provided intentionally and locally only at edges of the channel forming region contacting with the field oxide film; and a second impurity region presenting a conductive type opposite from the first impurity region is formed intentionally and locally within the channel forming region so as not to contact with the source region/drain region and the first impurity regions.

Another scheme of the invention is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein first impurity regions which shift an energy band of the channel forming region are provided intentionally and locally only at edges of the channel forming region contacting with the field oxide film; a second impurity region presenting a conductive type opposite from the first impurity region is formed intentionally and locally within the channel forming region so as not to contact with the source region/drain region and the first impurity regions; the first impurity regions suppress a depletion layer from spreading from the drain region to the source region and the second impurity region controls a threshold voltage.

A still other scheme of the invention is intended to a semiconductor device comprising at least a source region, a drain region and a channel forming region formed by utilizing a mono-crystal semiconductor thin film on an insulating layer; a field oxide film surrounding the source region, the drain region and the channel forming region; and a gate insulating film and a gate electrode formed on the channel forming region; wherein first impurity regions which shift an energy band of the channel forming region are provided intentionally and locally only at edges of the channel forming region contacting with the field oxide film; a second impurity region presenting a conductive type opposite from the first impurity region is formed intentionally and locally within the channel forming region so as not to contact with the source region/drain region and the first impurity regions; the first impurity regions suppress a depletion layer from spreading from the drain region to the source region and draw out minority carriers generated by impact ionization in the vicinity of the drain region to the outside of the channel forming region and the second impurity region controls a threshold voltage.

The semiconductor device which allows the high mobility and the high reliability to be obtained in the same time, i.e. the object of the present invention, may be realized by constructing as described above. The detail of the pinning FET of the present invention will be explained in the description of preferred embodiments.

BRIEF DESCRIPTION OF DRAWINGS

FIGS. 8A through 8E show structures of channel forming regions and an energy state thereof;

DESCRIPTION OF PREFERRED EMBODIMENTS

[First Embodiment]

At first, a structure of an active region (hereinafter a source region, a channel forming region and a drain region will be called collectively as such) of an N-channel type pinning FET of the present invention will be explained with reference to FIGS. 1A through 1C.

It is noted that a case of using an SOI substrate called an SIMOX substrate as a substrate for fabricating the pinning FET will be illustrated in the present embodiment. The SIMOX substrate is what a buried oxide film is formed by implanting oxygen into a mono-crystal silicon substrate and a mono-crystal silicon layer left on the buried oxide film is utilized as an active region.

Figure 1A:
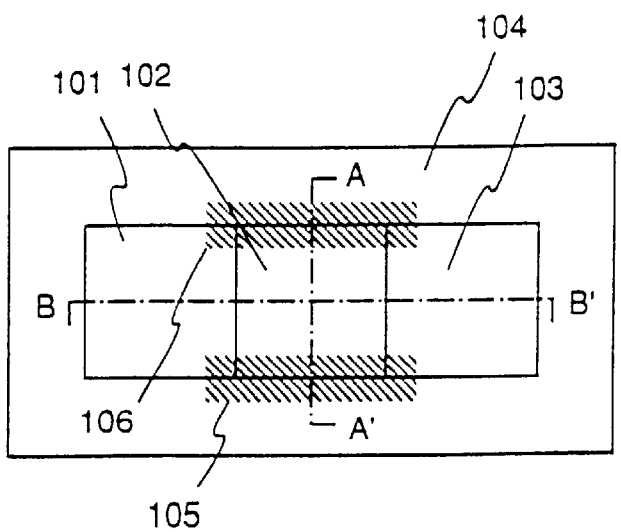
FIGS. 1A through 1C are diagrams for explaining an outline of a pinning FET.
Figure 1B:
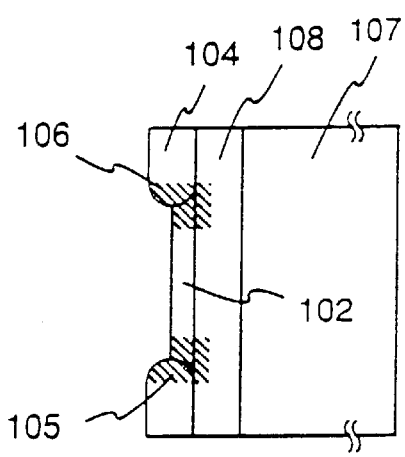
Figure 1C:
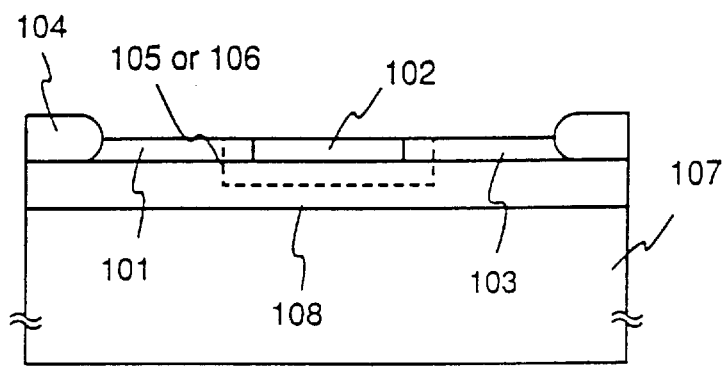

FIG. 1A is a plan view of the active region of the N-channel type pinning FET, FIG. 1B is a scion view taken along a line A—A' in the plan view of FIG. 1A and FIG. 1C is a section view taken along a line B—B' in the plan view of FIG. 1A.

As shown in FIG. 1A, the active region of the N-channel type pinning FET comprises a source region 101, a channel forming region 102 and a drain region 103. Then, a field oxide film 104 is formed so as to surround these regions to separate from other devices. The thickness of the active region made of the mono-crystal silicon layer is 10 to 300 nm (or preferably 20 to 75 nm).

It is noted that although no reference numeral is given, a gate insulating film is formed on the active region here. Further, although a gate electrode, an interlayer insulating film, a fetch electrode and the like are actually laminated thereon, they are not shown to simplify the figures. Then, only the active region will be focused and explained below.

In FIG. 1A, regions 105 and 106 are regions for pinning a depletion layer (hereinafter referred to as pinning regions), which are the most significant feature of the inventive semiconductor device. The pinning regions 105 and 106 may be formed by doping an impurity element which shifts an energy band of the channel forming region (in the direction of impeding the move of electrons). Accordingly, they may be called as regions where the energy band has been shifted.

Figure 12:
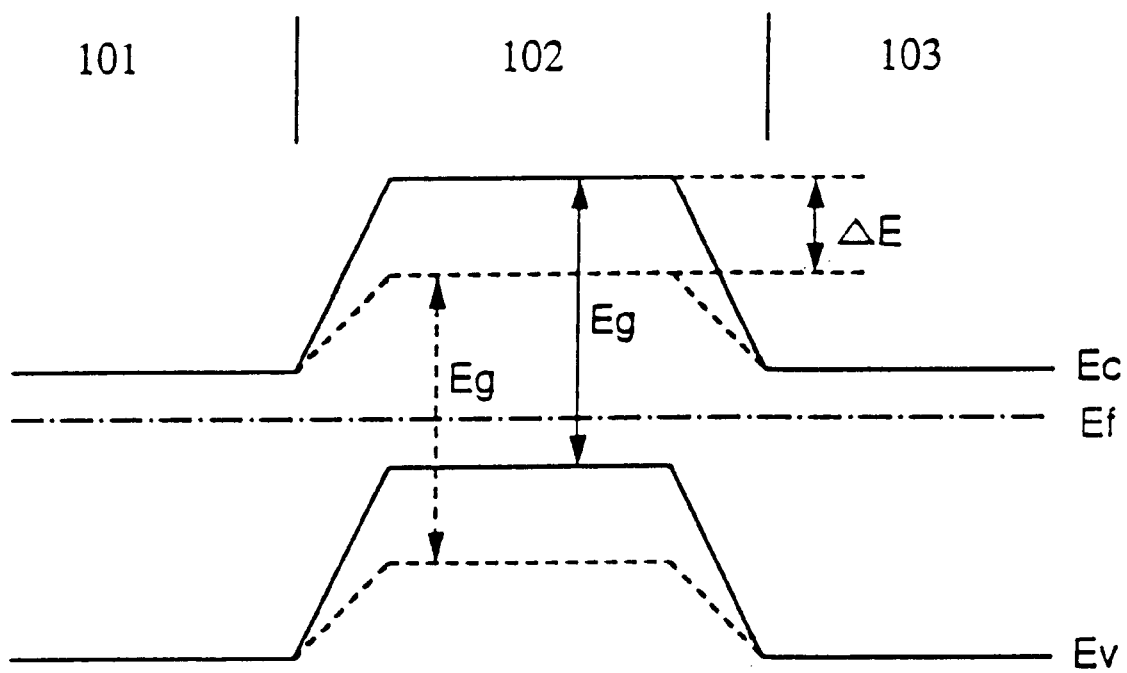
FIG. 12 is a diagram showing an energy state of a channel forming region.

Here, the impurity element which shifts the energy band will be explained with reference to a conceptual diagram as shown in FIG. 12. Shifting the energy band means to change the channel forming region which has been in the energy state shown by dotted lines to an energy state shown by solid lines.

FIG. 12 shows a case when the impurity element which gives a conductive type opposite from that of the source/drain region is doped to the channel forming region. In this case, while there is no change in an energy gap (Eg) of the doped region, the energy state shifts to the upper side as a whole (Fermi level Ef is lowered apparently).

Accordingly, a difference of energy corresponding to $\Delta E$ is produced between the undoped channel forming region and the impurity region. The height of this energy (potential) barrier varies depending on concentration of the doped impurity element.

Thus, the impurity element which is capable of shifting the energy band of the channel forming region and of creating the barrier is utilized in the present invention in forming the pinning regions. Because the source/drain region has an N-type conductivity in case of the present embodiment, an impurity element which gives the inverse conductivity is doped to the pinning regions 105 and 106. That is, a P-type impurity region is formed by doping an element selected from the XIII group, i.e. typically B (boron) or In (indium).

It is noted that the concentration of the impurity doped to the pinning regions 105 and 106 is controlled so that the pinning regions 105 and 106 become a fully high potential barrier with respect to the channel forming region. Typically, it may be set at $1\times10^{17}$ to $1\times10^{20}$ atoms/cm$^3$ (or preferably at $1\times10^{18}$ to $1\times10^{19}$ atoms/cm$^3$).

In FIG. 1A, the pinning regions 105 and 106 are formed so as to reach or overlap with the source region 101 and the drain region 103 at the ends thereof. Forming them so as to reach the inside of the source region 101 is one of important schemes of the present invention as described later. However, the pinning effect can be obtained without overlapping them with the drain region 103.

The pinning regions 105 and 106 are also formed so as to straddle the channel forming region 102 and the field oxide film 104 just by half each. It may be expected to reduce a leak current propagating through the boundary portion by doping the join part of the channel forming region 102 and the field oxide film 104. It is not always necessary to divide the pinning regions 105 and 106 into a half each and how to dispose them is within a discretion of a person who carries out the invention.

Figure 13:
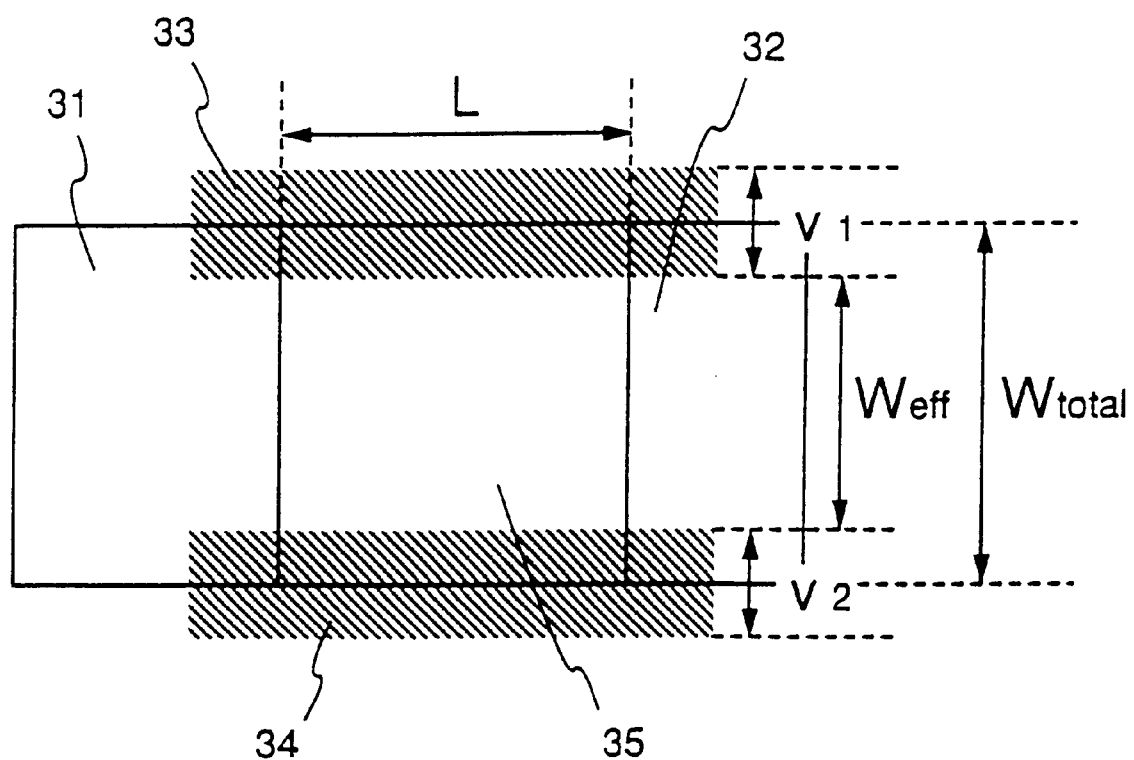
FIG. 13 is a diagram for explaining the definition of a channel length and a channel width.

Here, the definition of "channel length" and "channel width" will be explained with reference to FIG. 13. In FIG. 13, a distance between a source region 31 and a drain region 32 will be defined as a channel length (L). The present invention is effective when this length is less than 2 $\mu$m or typically 30 to 500 nm (or more preferably 50 to 200 nm). Further, the direction along this channel length will be called a channel length direction.

Further, a distance between pinning regions 33 and 34 will be defined as an effective channel width ($W_{eff}$). The present invention is effective when this width is 30 to 500 nm (or typically 50 to 200 nm). The direction along this channel width will be called a channel width direction. According to the present invention, the lower limit of the channel width is considered to be 30 nm considering the difficulty in maintaining an ON current (which flows when the TFT is in ON state) and in forming the pinning regions. Further, it becomes difficult to obtain the pinning effect when the channel width exceeds 500 nm.

It is noted that although the pinning effect seems to decrease when the thickness of the channel forming region is fully large as compared to the channel width, it is possible to obtain an enough pinning effect even when the channel width is less than 500 nm because the majority carriers which actually contribute to the operation of the transistor move only in the vicinity of the polar surface of the channel forming region.

When the width (length in the channel width direction) of the pinning regions 33 and 34 are assumed to be $v_1$ and $v_2$, respectively, the total channel width ($W_{total}$) is given as follows:

$$W_{total} = W_{eff} + \frac{1}{2}(v_1 + v_2)$$

That is, the total channel width ($W_{total}$) is defined by a length of the mono-crystal silicon layer forming the active region in the channel width direction.

Because the inventive semiconductor device is considered to be applied to the semiconductor device whose channel length and channel width are very small in particular, the size of the channel forming region 102 (the region 35 in FIG. 13) is also very small.

Therefore, a very fine ion implantation technique is required to form the pinning regions 105 and 106. Further, a pinning region whose width is around 10 to 300 nm (or preferably 50 to 100 nm) must be formed by a very fine exposure technique using an excimer laser, an electron beam or a focused ion beam in forming a pattern.

It is noted that it is preferable to activate the impurity element doped to the pinning regions 105 and 106 by means of furnace annealing, laser annealing, lamp annealing or the like. However, a care must be taken so as not to narrow the effective channel width by suppressing thermal diffusion as much as possible. For instance, the impurity element may be fully activated while suppressing the thermal diffusion of the impurity element by implementing the activation in around 500 to 800° C. (or preferably 600 to 700° C.) in case of the furnace annealing.

Further, the impurity ions may be activated simultaneously with the implantation thereof by heating the substrate. Further, a rate of activation of the impurity ions at the time of implantation may be improved by increasing RF power in implanting the ions. The activation may be carried out by utilizing those sole effects or by combining with the above-mentioned annealing step.

Next, the active region of the N-channel type pinning FET will be explained with reference to FIG. 1B which is a section view taken along the line A—A' in the plan view in FIG. 1A. It is noted that in FIG. 1B, the components explained in FIG. 1A will be explained by sing the same reference numerals.

As shown in FIG. 1B, the N-channel type pinning FET further comprises a mono-crystal silicon substrate 107 and a buried oxide film 108 whose thickness is 0.05 to 0.5 µm. It has been reported that it is effective to thin the buried oxide film 108 as much as possible to suppress the short-channel effect (preferably 0.05 to 0.1 µm). Then, the pinning regions 105 and 106 are formed so as to overlap with the field oxide film 104.

The depth of reach (length in the depth direction) of the pinning regions 105 and 106 is desirable to be at least more than the thickness of the mono-crystal silicon layer. In this case, it is also effective to form them so as to eat into the buried oxide film 108. It is also possible to form them so as to penetrate through the buried oxide film 108 and to reach the mono-crystal silicon substrate 107.

It is noted that although the SIMOX substrate is used in the present embodiment, the conductive type of the mono-crystal silicon substrate 107 which is the base thereof may be N or P-type. It is noted that all kinds of mono-crystal silicon substrates formed by the normal CZ method, FZ method or other fabrication methods may be used as the mono-crystal silicon substrate.

However, it is preferable to use a high resistant silicon substrate (whose concentration of dopant is less than $1 \times 10^{15}$ atoms/cm$^3$) containing a less amount of dopant (doping concentration of impurity element) in order to enhance the mobility of the carriers (to reduce impurity scattering).

FIG. 1C is a section view taken along the line B—B' in FIG. 1A. The source region 101 and the drain region 103 are formed by implanting ions of P (phosphorus) or As (arsenic).

Although not seen in the section B—B' a positional relationship of the pinning region 105 (or the pinning region 106) is indicated by a dotted line. As shown in FIG. 1C, the pinning regions 105 and 106 are formed from the source region 101 to the drain region 103.

The N-channel type pinning FET of the present embodiment is a semiconductor device having the structure described above. Next, the roles played by the pinning regions 105 and 106 and effects obtained by them will be explained.

At first, a first effect thereof will be explained. The biggest object of the present invention is to suppress (to pin) the depletion layer from spreading from the drain side to the source side to prevent the potential barrier on the source side from dropping by the drain voltage. It becomes possible to fully prevent the drop of the threshold voltage and the drop of the withstand voltage which is otherwise caused by the punch-through effect by suppressing the spread of the depletion layer.

In FIGS. 1A through 1C, the pinning regions 105 and 106 which are formed intentionally and locally in the channel forming region 102 act as stoppers against the depletion layer which spreads from the drain side and suppress the spread of the depletion layer effectively. It is noted that the spread of the depletion layer in the depth direction is restricted by the buried oxide film.

Accordingly, they allow to prevent the punch-through phenomenon because the diffusion potential on the source side will not be lowered by the spread of the depletion layer. Further, they allow to avoid the drop of the threshold voltage because the increase of the electric charge of the depletion layer due to the spread of the depletion layer is suppressed.

Then, it becomes possible to suppress or to prevent the short-channel effect which has been a very serious problem in the sub-micronization by forming the pinning regions 105 and 106 as described above. This effect is the most important effect of the inventive semiconductor device.

It is noted that the above-mentioned effect may be obtained by providing the pinning regions 105 and 106 at least at the join part of the channel forming region 102 with the drain region 103. However, it is most preferable to dispose them as shown in FIG. 1A in order to obtain a fourth effect (of drawing out the minority carriers through the pinning region) described later.

Next, a second effect will be explained. According to the present invention, a narrow-channel effect may be enhanced intentionally. The narrow-channel effect is a phenomenon which is observed when a channel width is extremely narrow and which brings about an increase of the threshold voltage (detailed in "Submicron Device I" referenced in the description of the prior art).

Figure 4:
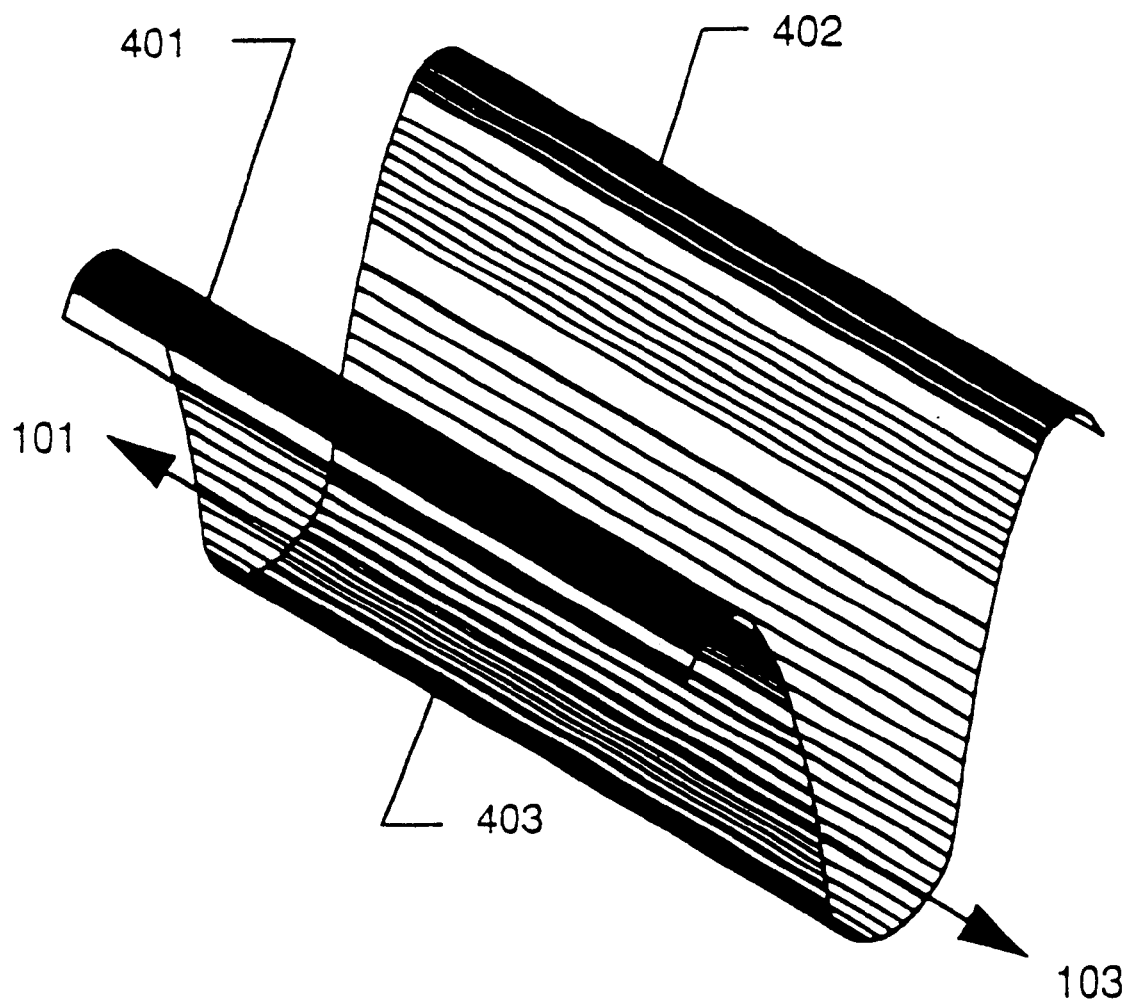
FIG. 4 is a diagram showing an energy state of a channel forming region.

FIG. 4 shows the energy state (state of potential) of the channel forming region 102 and the pinning regions 105 and 106 when the pinning FET of the present embodiment is operative. In FIG. 4, regions 401 and 402 correspond to the energy state of the pinning regions 105 and 106 and a region 403 corresponds to the energy state of the channel forming region 102.

As it is apparent also from FIG. 4, the pinning regions 105 and 106 form high energy barriers and the channel forming region whose energy state is low forms a valley of energy. Therefore, carriers move the channel forming region where the energy state is low preferentially.

Because the pinning regions 105 and 106 form the high energy barriers as described above, the threshold voltage of that part increases. As a result, the threshold voltage observed as a whole also increases. It is a matter of course that this occurs because the pinning regions 105 and 106 have the conductive type opposite from that of the source and drain regions and the above-mentioned effect cannot be obtained when the conductive type is the same.

As described above, the present invention allows the strength of the narrow-channel effect to be controlled by changing the concentration of the impurity to be doped to the pinning regions and by designing its shape differently.

For instance, in an SOIFET in which a gate electrode is made of an N-type polysilicon film or an aluminum film, the threshold voltage may become as small as 0 to 0.5 V and may take a negative value in some cases, thus allowing a normally-ON operation. However, the present invention allows the threshold voltage to be increased and controlled to a desirable threshold voltage by enhancing the narrow-channel effect by increasing the impurity concentration in the pinning regions.

It is also possible in some cases to take a balance between the drop of the threshold voltage due to the short-channel effect and the increase of the threshold voltage due to the narrow-channel effect to desired values by controlling the pinning effect.

In case of the present embodiment, because boron or indium is doped to the pinning regions, the threshold voltage shifts in the positive direction in that part. That is, because the threshold voltage increases locally, the threshold voltage increases as a whole by the increase.

Accordingly, it is possible to control the threshold voltage also by setting the concentration of impurity doped to the pinning region at an appropriate value. However, the feature of the present invention is that the impurity element is doped locally to the end and it is a technological concept totally different from channel doping by which impurity is doped in batch on the whole surface.

Next, a third effect will be explained. The N-channel type pinning FET of the present embodiment has a merit that the channel forming region 102 is formed of a region which is intrinsic or substantially intrinsic and the majority carriers (electrons) move through that region.

The intrinsic region mentioned here means a region to which no impurity element which gives the N or P-type nor impurity elements such as carbon, nitrogen and oxygen are doped intentionally. For instance, the intrinsic channel forming region may be obtained by fabricating an I-type silicon substrate (intrinsic silicon substrate) by an advanced refining technology and by using it. Further, the substantially intrinsic region refers to a region in which the conductivity is offset intentionally by doping an inverse conductive impurity or a region having one conductive type in a range in which the threshold voltage can be controlled.

For instance, it may be said that a silicon substrate is substantially intrinsic when its concentration of dopant (phosphorus, arsenic, boron, indium, antimony, etc.) is less than $5\times10^{15}$ atoms/cm$^3$ (or preferably less than $5\times10^{14}$ atoms/cm$^3$) and the concentration of carbon, nitrogen or oxygen is less than $2\times10^{18}$ atoms/cm$^3$ (or preferably less than $5\times10^{17}$ atoms/cm$^3$). In that sense, mono-crystal silicon substrates used in semiconductor circuits in general are all substantially intrinsic unless no impurity is doped intentionally in its processing step.

When the region where the carriers move is intrinsic or is substantially intrinsic, the drop of the mobility which might be caused by the impurity scattering becomes very small. This is a great advantage of the present invention that the short-channel effect can be suppressed or prevented without using the channel doping.

That is, while an impurity is doped to the whole surface of the channel forming region by means of channel doping in the conventional IC, it causes intensive impurity scattering and poses a problem that the mobility (field effect mobility) is small even when mono-crystal is used. However, the pinning FET of the present invention allows the high mobility to be obtained because the region where the carriers move is the intrinsic or substantially intrinsic region where there is almost no impurity.

Further, because the pinning FET is fabricated on the SOI substrate in the present invention, almost no (only one or several elements) impurity element exists in the channel forming region formed of the thin film mono-crystal silicon layer. As a result, because a speed overshooting effect (see K. Ohuchi et. al., Jpn. J. Appl. Phys. 35, pp. 960, 1996) by which the mobility of electrons becomes higher than the normal one occurs even in room temperature, the mobility becomes very large.

All of these effects can be achieved by minimizing the scattering of the carriers. The scattering of the carriers is categorized roughly into lattice scattering and impurity scattering and the overall mobility is decided under their influence.

The mobility ($\mu_{lattice}$) influenced by the lattice scattering is proportional to $-3/2$ power of a temperature (T) and is proportional to $-5/2$ power of an effective mass (m*) of carriers. This relationship may be expressed as follows:

$$\mu_{lattice} \propto (m^*)^{-5/2} T^{-3/2} \qquad (1)$$

The mobility ($\mu_{impurity}$) influenced by the impurity scattering is proportional to $3/2$ power of the temperature (T) and is proportional to $-1/2$ power of the effective mass (m*) of carriers. It is also proportional to concentration (N) of the ionized impurity. This relationship may be expressed as follows:

$$\mu_{impurity} \propto (m^*)^{-1/2} N^{-1} T^{3/2} \qquad (2)$$

Then, the overall mobility ($\mu_{total}$) observed under their influence may be expressed as follows:

$$\mu_{total} = (1/\mu_{lattice} + 1/\mu_{impurity})^{-1} \qquad (3)$$

That is, that the channel forming region is intrinsic or substantially intrinsic means that the impurity concentration N in Equation (2) approaches to 0 unlimitedly and the mobility ($\mu_{impurity}$) influenced by the impurity scattering approaches to infinity.

As a result, because the term of $1/\mu_{impurity}$ becomes so small that it is negligible in Equation (3), the overall mobility ($\mu_{total}$) approaches to the mobility ($\mu_{lattice}$) influenced by the lattice scattering. That is, it is possible to assume it as the mobility in which only the lattice scattering is taken into consideration.

It is also possible to reduce $\mu_{lattice}$ further by reducing the effective mass (m*) of the carriers. It has been reported in a document that electrons assume the least effective mass when they advance to <100> axis of mono-crystal silicon in case of very low temperature of 4 [K] in particular.

In this case, it is effective to cause the channel length direction (in which the carriers move) to coincide with the <100> axis in forming the channel forming region. It is also effective to arrange so as to lessen collision with the crystal lattice by registering the orientation of the crystal lattice with the carrier traveling direction to reduce the lattice scattering.

Because the drop of the mobility which is caused by the impurity scattering is almost negligible in the inventive pinning FET as described above, the overall mobility ($\mu_{total}$) can be increased significantly by arranging such that the carriers can move in the state where the lattice scattering is minimized.

Next, a fourth effect will be explained. While it has been already described that the pinning regions of the present invention have the functions of preventing the short-channel effect and of controlling the threshold voltage, the pinning regions play a very important role, beside those described above, in preventing the withstand voltage between the source and the drain from dropping due to the impact ionization (substrate floating effect).

As explained in the description of the prior art, the minority carriers (positive holes in case of the present embodiment) generated by the impact ionization are accumulated under the channel and turn on the parasitic bipolar transistor, thus causing the carrier implantation induced breakdown phenomenon.

However, in case of the N-channel type pinning FET having the structure as shown in FIGS. 1A through 1C, the positive holes generated by the impact ionization flow through the pinning regions 105 and 106 and reach the source region 101 as they are. Then, it is possible to prevent the positive holes from accumulating by connecting external terminals to the pinning regions 105 and 106 to draw out the positive holes.

Thus, the pinning regions of the invention function as paths for flowing the minority carriers (positive holes) generated by the impact ionization in the direction opposite from the majority carriers (electrons) and for drawing out to the outside as they are.

It is noted that because the pinning regions 105 and 106 have the P-type conductivity in case of the present embodiment, the electrons do not move, though the positive holes can move. That is, the electrons, i.e. the majority carriers, flow only through the channel forming region 102.

Because it is possible to prevent the carrier implantation induced breakdown phenomenon caused by the impact ionization by this fourth effect, the highly reliable semiconductor device having the very high withstand voltage may be realized by the synergetic effect with the first effect (of preventing the withstand voltage from dropping by the punch-through effect).

It is noted that the pinning region which is the feature of the present invention is formed in the channel forming region of an insulated gate field effect transistor and is not limited basically by the transistor structure. Accordingly, it is possible to follow the conventional MOSFET fabrication technology in fabricating the pinning FET shown in the present embodiment except of the part related to the present invention of providing the pinning region.

[Second Embodiment]

A structure of an active region of a P-channel type pinning FET of the invention will be explained in the present embodiment with reference to FIGS. 2A through 2C. It is noted that the case of using the SIMOX substrate similarly to the first embodiment will be shown in the present embodiment.

Figure 2A:
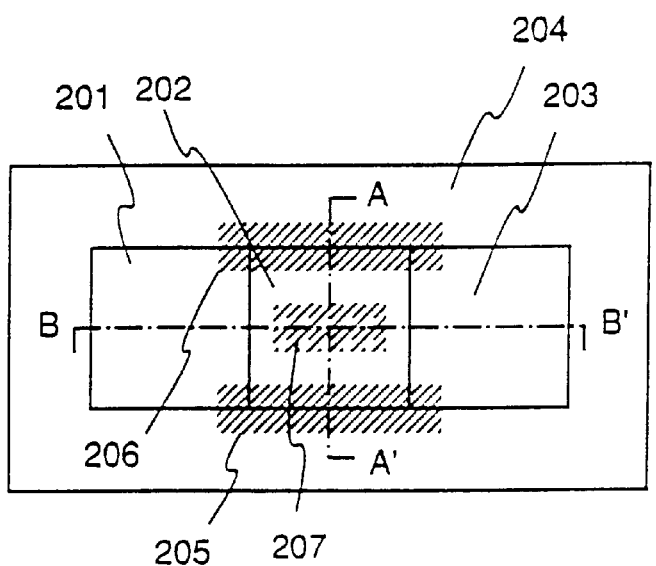
FIGS. 2A through 2C are diagrams for explaining an outline of another pinning FET.
Figure 2B:
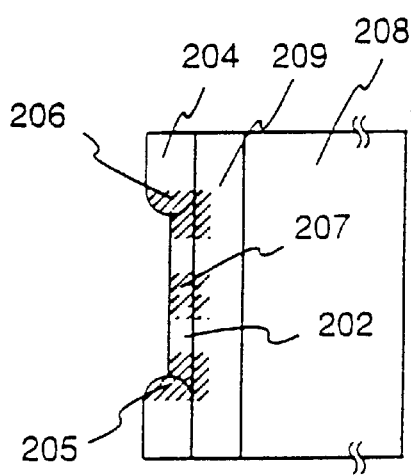
Figure 2C:
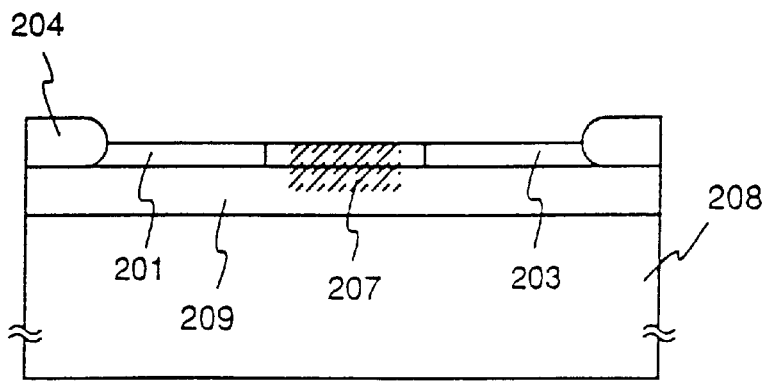
Figure 3A:
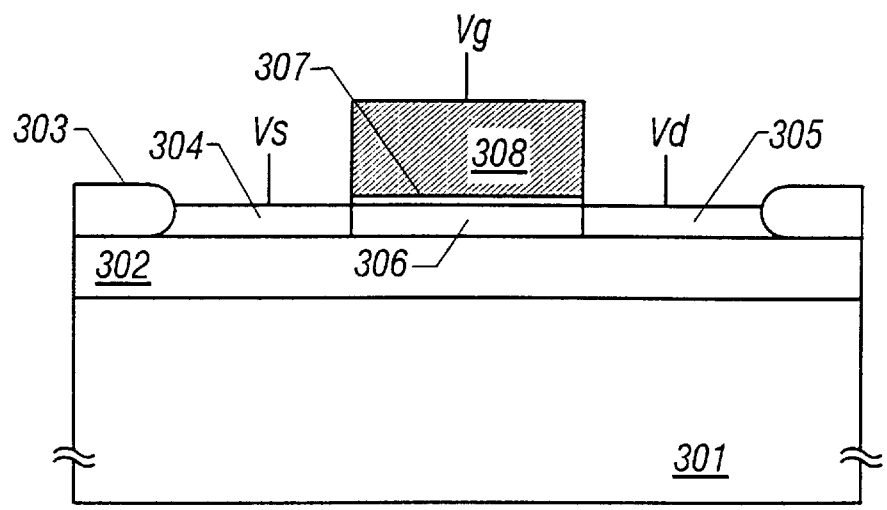
FIGS. 3A through 3C are diagrams for explaining a short-channel effect.
Figure 3B:
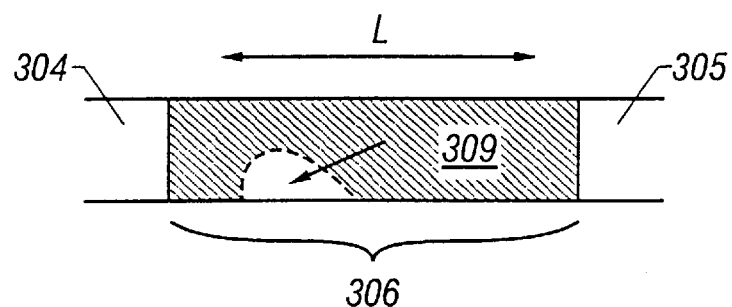
Figure 3C:
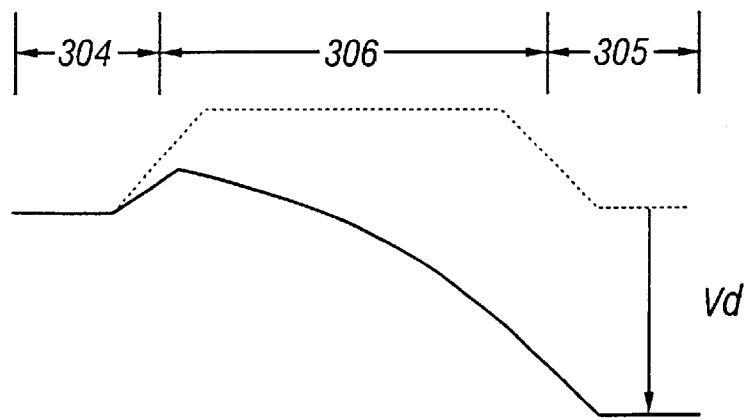

Similarly to FIGS. 1A through 1C used in the first embodiment, FIG. 2A is a plan view of the active region of the P-channel type pinning FET, FIG. 2B is a section view taken along a line A—A' in the plan view of FIG. 2A and FIG. 2C is a section view taken along a line B—B' in the plan view of FIG. 2A. It is noted that description of a gate insulating film, a gate electrode, an interlayer insulating film, a fetch electrode and the like is omitted and only the active region will be explained in the present embodiment similarly to the first embodiment.

However, because the basic structure of the N-channel type pinning FET and the P-channel type pinning FET is same, the pinning effect which is the main theme of the present invention may be obtained almost in the same manner with the first embodiment. Then, only the difference from the first embodiment will be explained in detail here and the contents fully explained already in the first embodiment will be omitted here.

As shown in FIG. 2A, the active region of the P-channel type pinning FET comprises a source region 201, a channel forming region 202, a drain region 203, a field oxide film 104 and pinning regions (first impurity region) 205 and 206. In case of the present embodiment, the pinning regions 205 and 206 are formed by doping an impurity element (impurity element which gives the N-type conductivity) which shifts the energy band in the direction of impeding the move of the positive holes, e.g. typically phosphorus or arsenic selected from the XV group. Sb (antimony) may be used in some cases.

In this case, the concentration of the impurity doped to the pinning regions 205 and 206 may be controlled in the same manner with the first embodiment and may be set typically at $1\times10^{16}$ to $1\times10^{20}$ atoms/cm$^3$ (or preferably at $1\times10^{17}$ to $5\times10^{18}$ atoms/cm$^3$). However, the threshold voltage may be controlled readily by suppressing the doping concentration low as described later.

The pinning regions 205 and 206 also form barriers whose energy level is high for positive holes. Its detailed explanation will be omitted here because it can be readily understood when considered by replacing the source/drain region with the P-type region in the band chart explained in FIG. 12.

By the way, what is clearly different between the P-channel type pinning FET shown in the present embodiment and the N-channel type pinning FET shown in the first embodiment is that there exists an inverse conductive type impurity region (second impurity region) between the pinning regions 205 and 206.

The impurity region 207 is a region formed by doping boron or indium and having the P-type conductivity. Accordingly, it does not become a barrier at all for the positive holes which are the majority carriers and functions fully as a moving path thereof. The present embodiment is characterized in that the impurity region 207 is used for controlling the threshold voltage. This point will be described later.

The channel length and the channel width of the P-channel type pinning FET may be designed in the same manner with the N-channel type pinning FET as shown in FIG. 2A. However, because the impurity region 207 is not a region which impedes the move of the positive holes, it may be included in the effective channel width ($W_{eff}$).

The pinning regions 205 and 206 and the impurity region 207 for controlling the threshold voltage are formed by using a very fine ion implanting technology. The formation of their patterns is performed by using a photolithgraphy technology using an excimer laser, an electron beam, a focused ion beam or the like.

As shown in FIG. 2B which is a section view taken along a line A—A' in the plan view of FIG. 2A, the P-channel type pinning FET also comprises a mono-crystal silicon substrate 208 and a buried oxide film 209. In the present embodiment, a high resistant N or P-type mono-crystal silicon substrate is used. It is needless to say that the reason why the high resistant substrate is used is to enhance the mobility of the carriers.

Then, the pinning regions 205 and 206 are formed so as to overlap with the field oxide film 204 and the impurity region 207 is formed therebetween. The pinning regions 205 and 206 and the impurity region 207 are all formed so as to reach the inside of the buried oxide film 209 in the present embodiment.

As shown in FIG. 2C which is a section view taken along a line B—B' in FIG. 2A, the source region 201 and the drain region 203 are formed by implanting boron or indium ions.

The impurity region 207 for controlling the threshold voltage is seen as shown in FIG. 2C at the section of the line B—B'. The source region 201 and the drain region 203 are formed separately in the present embodiment so as not to short between the source and the drain.

While the inventive P-channel type pinning FET is constructed as described above, the roles played by the pinning regions 205 and 206 and the impurity region 207 as well as effects obtained as a result will be explained below.

A first effect is the effect of suppressing the depletion layer from spreading from the drain side as described in the first embodiment. It then allows to suppress or prevent the short-channel effect such as the punch-through phenomenon and the drop of the threshold voltage effectively.

A second effect is that the threshold voltage may be controlled by controlling the narrow-channel effect similarly to the first embodiment. The narrow-channel effect may be controlled by adjusting the impurity concentration of and by designing the shape of the pinning regions 205 and 206 appropriately.

However, when an N-type poly-silicon gate or an aluminum film is used as often used in general, the threshold voltage is inclined to be biased in the minus direction similarly to the first embodiment. That is, it means that an absolute value of the threshold voltage increases because the P-channel type pinning FET is exemplified in the present embodiment.

In addition to that, the narrow-channel effect also acts in the direction of increasing the threshold voltage and the element selected from the XV group to be doped to the pinning region also acts in the direction of shifting the threshold voltage in the minus direction. That is, the absolute value of the threshold voltage increases more than its necessity as a result.

To that end, the impurity region 207 is formed for the purpose of shifting the threshold voltage forcibly in the positive direction in the P-channel type pinning FET of the present embodiment. However, because the impurity region 207 has the same conductive type (P-type in this case) with the source/drain region, a measure has to be taken so that no short occurs between the source and the drain.

Then, to that end, the impurity region 207 is formed while separating from the source and drain regions as shown in FIG. 2A in the present embodiment. Further, the doping concentration of boron or indium doped to the impurity region 207 is set at $1\times10^{17}$ to $1\times10^{20}$ atoms/cm$^3$ (or preferably at $1\times10^{17}$ to $1\times10^{20}$ atoms/cm$^3$).

Because the impurity element doped to the impurity region 207 is an element selected from the XIII group, the threshold voltage shifts to the positive direction in the impurity region 207. Therefore, because the threshold voltage observed as a whole shifts also in the positive direction, the absolute value of the threshold voltage becomes small.

It is also effective so as not to increase the threshold voltage in the minus direction as much as possible while keeping the pinning effect by suppressing the concentration of the element in the XV group to be doped to the pinning regions 205 and 206 to keep to be weak N-type (N$^-$-type).

Next, a third effect is that the high mobility may be realized because the channel forming region 202 (the impurity region 207 is distinguished from the channel forming region) is intrinsic or substantially intrinsic similarly to the first embodiment. The mobility may be enhanced also by the speed overshoot effect as a matter of course.

Further, when phosphorus is used as the impurity element to be doped to the pinning regions 205 and 206, the effect for gettering a metal element by phosphorus may be exerted in the present embodiment. It allows the impurity scattering in the channel forming region 202 to be minimized by gettering the metal element remaining within the channel forming region 202 to the pinning regions 205 and 206.

The positive holes which are the majority carriers flow through the channel forming region 202 and the impurity region 207 and do not flow through the pinning regions 205 and 206 also in the present embodiment. That is, because the impurity region 207 does not impede the move of the positive holes at all, it will not narrow the effective channel width.

The effect of drawing out the minority carrier which is a fourth effect of the present embodiment is obtained in the same manner with the first embodiment. Because an ionization rate of positive holes, i.e. the majority carriers, is as small as about $\frac{1}{1000}$ of an ionization rate of electrons in the conventional P-channel type MOSFET, a probability of occurrence of impact ionization is very small. Accordingly, the carrier implantation induced breakdown phenomenon is not a problem so much.

However, the mobility of the carriers (positive holes) is very large because the channel forming region of the inventive P-channel type pinning FET is intrinsic or substantially intrinsic. That is, it is assumed that a considerably high energy state is created in the vicinity of the drain.

Accordingly, the effect of preventing the carrier implantation induced breakdown phenomenon may be said to be a very effective effect in realizing the high reliability.

As described above, the inventive P-channel type pinning FET is the semiconductor device which realizes the high reliability and the high mobility in the same time. It is also noted that the inventive P-channel type pinning FET is not confined only to the structure shown in the present embodiment similarly to the first embodiment and the structure thereof other than the channel forming region may be formed by following the conventional SOIFET technology.

[Third Embodiment]

The case of forming the pinning FET on the mono-crystal silicon substrate has been explained in the first and second embodiments. In such cases, the active region (the source region, channel forming region and drain region) is made from the weak N or P-type mono-crystal silicon.

However, the semiconductor which can be utilized in the present invention is not limited to the mono-crystal silicon. That is, it is possible to form the active region or at least a part thereof by a compound semiconductor or by a laminating the compound semiconductor and the mono-crystal silicon.

For instance, gallium arcenide (GaAs), indium phosphide (InP) or silicon germanium ($Si_xGe_{1-x}$: where x is 0.5 to 9.5) may be used as the compound semiconductor.

When the compound semiconductor of $Si_xGe_{1-x}$ is used for the channel forming region in particular, a carrier mobility higher than the case of using mono-crystal silicon can be obtained. That is, it is possible to realize a semiconductor device having a higher mobility by combining this effect with the effects of the present invention described above.

[Fourth Embodiment]

Although the case of utilizing the SIMOX substrate as the SOI substrate has been illustrated in the first and second embodiments, another SOI substrate may be also used. For instance, a laminated SOI substrate may be used.

The laminated SOI substrate is a substrate obtained by laminating two mono-crystal silicon substrates by bonding by an oxide film. One which turns out to be a supporting substrate will be called a base wafer and the other one which turns out to be a mono-crystal silicon layer will called a bond wafer.

It is preferable to use a technique called smart cutting. The smart cutting is characterized in that a layer containing a light element (typically hydrogen) is formed on the bond wafer in advance. When a heat treatment is implemented after bonding them, the layer containing the light element is embrittled. Then, it cracks and is separated from the bond wafer. Therefore, it allows the bond wafer to be used again and is advantageous economically.

It is also effective to use a technology called an ELTRAN (Epitaxial Layer TRANsfer). According to this method, a porous silicon layer is formed at first by anodizing the bond wafer and a mono-crystal silicon layer is grown epitaxially thereon.

Then, the bond wafer is bonded with the base wafer and is polished. The polishing is stopped when the porous silicon layer appears and the porous silicon layer is dissolved chemically to leave a very thin film made of the mono-crystal silicon.

Thus, the ELTRAN has an advantage that it allows the mono-crystal silicon layer whose homogeneity is very high to be obtained by utilizing the high selectivity between the porous silicon layer and the mono-crystal silicon layer.

While a PACE method and others have been developed for the laminated SOI substrate, beside them, such technology may be also used.

It is possible to use not only the laminated SOI substrate but also an SOI substrate fabricated by other methods. For instance, there is an SOI substrate in which a mono-crystal silicon layer is formed on a sapphire substrate. Magnesia spinel ($MgOAl_2O_3$) or calcium fluoride is used in some cases in stead of the sapphire substrate. Further, an SOI substrate formed by using a technology called FIPOS (Full Isolation by Porous Oxidized Silicon) may be also utilized.

Various SOI substrates have been developed beside the SOI substrates shown in the present embodiment. The present invention allows the SOI substrates fabricated by any method to be used regardless of the fabrication methods thereof.

[Fifth Embodiment]

A case of fabricating a CMOS semiconductor device in which the N-channel type pinning FET and the P-channel type pinning FET fabricated on a P-type mono-crystal silicon substrate are combined complementarily will be explained in the present embodiment.

Figure 5A:
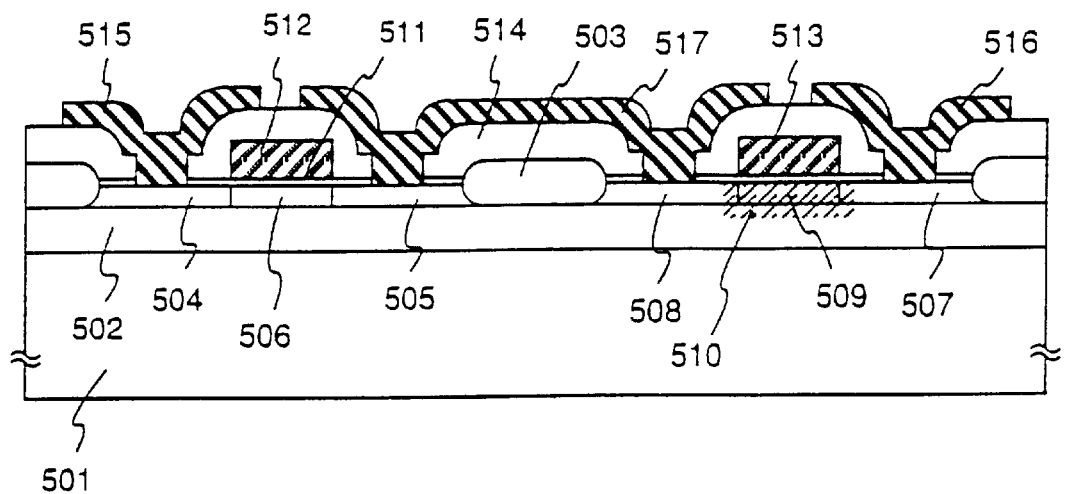
FIGS. 5A and 5B are diagrams showing a structure of a CMOS semiconductor device.
Figure 5B:
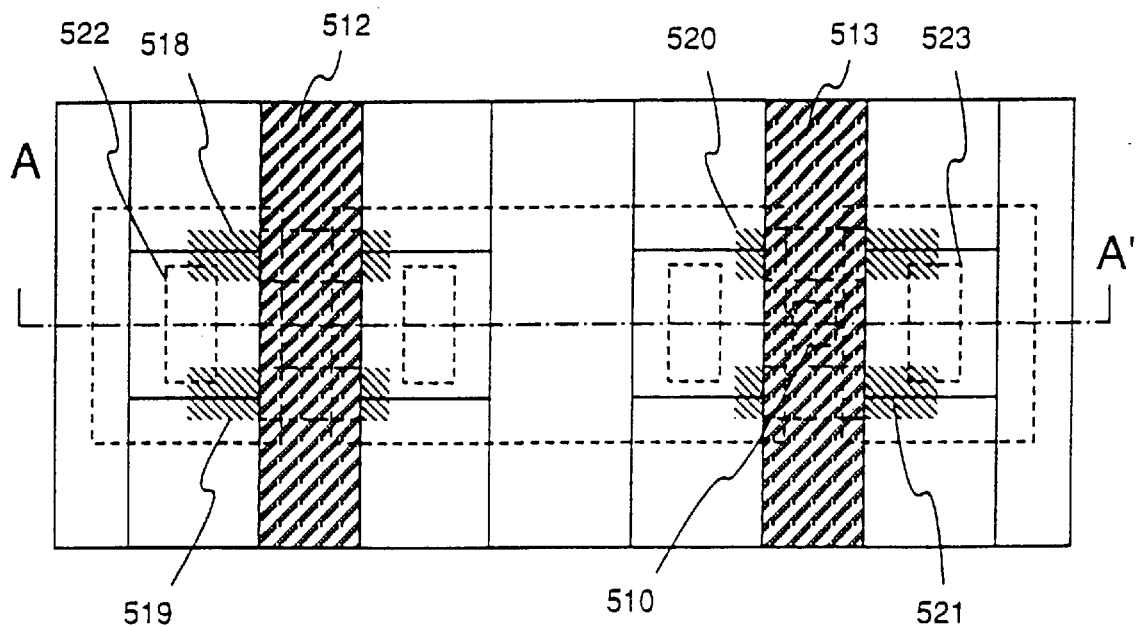

FIGS. 5A and 5B show the structure of the CMOS semiconductor device of the present embodiment, wherein FIG. 5A is a section view of the CMOS semiconductor device taken in the channel length direction and FIG. 5B is a plan view of the CMOS semiconductor device. It is noted that FIG. 5A corresponds to a section view taken along a line A—A' in FIG. 5B.

As shown in FIG. 5A, the semiconductor device comprises a mono-crystal silicon substrate 501 to which dopant (boron or arsenic) of about $1 \times 10^{15}$ atoms/$cm^3$ has been doped and which shows the weak P-type conductivity. Here, this conductive type will be denoted by $P^{--}$.

It is noted that the strength of the conductive types will be denoted by superior plus or minus symbols in the present specification. For example, the strength of the N-type conductivity has a relationship of $N^{++} > N^+ > N^- > N^{--}$. Further, the strength of the P-type conductivity has a relationship of $P^{++} > P^+ > P^- > P^{--}$.

Then, a buried oxide film 502 is formed on the P-type silicon substrate 501 and two mono-crystal silicon layers (no reference numeral appended) insulated and separated by a field oxide film 503 are formed on the buried oxide film 502.

A source region 504 and a drain region 505 of the N-channel type pinning FET are formed in the $N^+$ region on one of the two mono-crystal silicon layers and an intrinsic or substantially intrinsic channel forming region 506 is formed therebetween. The source and drain regions are formed by doping phosphorus, arsenic or antimony.

A source region 507 and a drain region 508 of the P-channel type pinning FET are formed in the $P^+$ region on the other mono-crystal silicon layer and a channel forming region 509 is formed therebetween. In this case, the source and drain regions are formed by doping boron or indium.

It is noted that an impurity region 510 for controlling the threshold voltage is formed locally in the channel forming region (right under a gate electrode) of the P-channel type pinning FET by doping boron or indium.

The semiconductor device further comprises a gate insulating film 511 and gate electrodes 512 and 513 of the N-channel type pinning FET and the P-channel type pinning FET, respectively. A poly-silicon film, a metal film or their laminate may be used as a material of the gate electrode (this point is the same also in the first and second embodiments). It is also possible to adopt a poly-side structure or a dual gate CMOS structure.

The gate electrodes 512 and 513 are coated by an interlayer insulating film 514, and source electrodes 515 and 516 and a common drain electrode 517 are formed thereon.

It is noted that the CMOS semiconductor device of the present embodiment is characterized in the disposition of the source electrodes 515 and 516. This point will be explained below with reference to FIG. 5B.

In FIG. 5B, however, the components already explained with reference to FIG. 5A will be denoted by the same reference numerals and an explanation thereof will be omitted here. Further, the source electrodes 515, 516 and the drain electrode 517 are shown by dotted lines in order to make the diagram comprehensible.

Although not shown in FIG. 5A, pinning regions 518 through 521 are formed at the both edges of the channel forming regions as shown in FIG. 5B. It is noted that the pinning regions 518 and 519 of the N-channel type pinning FET are formed by the $P^+$ region (or by the $P^{++}$ region) by doping the impurity element which is selected from the XIII group (i.e. boron or indium) and which shifts the energy band in the direction of impeding the move of electrons.

The pinning regions 520 and 521 of the P-channel type pinning FET are formed by the $N^+$ region (or by the $N^-$ region) by doping the impurity element which is selected from the XV group (i.e. phosphorus, arsenic or antimony)

and which shifts the energy band in the direction of impeding the move of positive holes.

By the way, the pinning regions 518 through 521 function as paths for discharging the minority carriers in the present invention as described before. Then, it is possible to prevent the minority carriers from accumulating effectively by constructing so that the source electrode 515 is electrically connected with the pinning regions 518 and 519 (or the source electrode 516 with the pinning regions 520 and 521).

By constructing as described above, the potentials of the source electrodes 515 and 516 and the pinning regions 518 through 521 are equalized. Because the source electrodes 515 and 516 are grounded in normal cases, the minority carriers are readily drawn out. The same effect can be obtained even when the source electrodes are not grounded by appropriately setting the potential so that the same effect can be obtained.

The above-mentioned structure may be obtained by creating contact holes 522 and 523 at the positions as shown in FIG. 5B. That is, in case of the N-channel type pinning FET (on the left side of the figure), it is constructed so that the source electrode 515 contacts with the source region 504 as well as the pinning regions 518 and 519 within the contact hole.

The P-channel type pinning FET is also constructed in the same manner. However, the phenomenon of deteriorating the withstand voltage between the source and the drain hardly occurs by the impact ionization because the majority carriers are positive holes in the P-channel type pinning FET. Therefore, it is not always necessary to draw out the minority carriers in case of the P-channel type pinning FET.

The CMOS semiconductor device as shown in the present embodiment may be fabricated by complementarily combining the N-channel type pinning FET and the P-channel type pinning FET shown in the first and second embodiments as described above.

The structure of the CMOS semiconductor device to which the present invention is applicable is not confined only to the structure shown in the present embodiment as a matter of course. An additional structure such as an LDD structure and a saliside structure conventionally used may be added as necessary.

[Sixth Embodiment]

A case of adopting a structure different from the first, second or fifth embodiment to draw out the minority carriers from the pinning regions will be explained in the present embodiment.

Figure 6A:
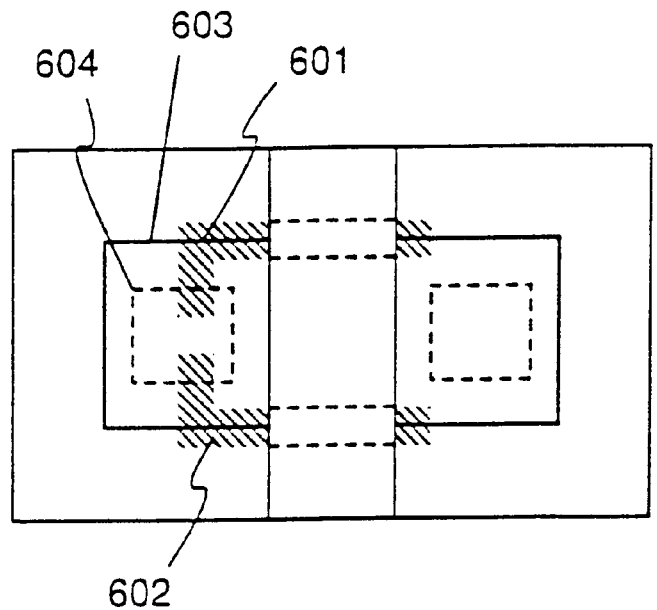
FIGS. 6A and 6B are diagrams showing shapes of pinning regions.

In case of the structure shown in FIG. 6A, pinning regions 601 and 602 are formed so as to eat into the inside within a source region 603. Such structure allows the positive holes to be drawn out efficiently because an area of the pinning region exposed within a contact hole 604 is increased and an area contacting with a source electrode is increased.

However, the structure shown in FIG. 6A can be adopted only when the positional relationship between the source electrode and the drain electrode is decided. That is, it is not suited to the case when the source and drain regions are switched periodically like a pixel transistor of an active matrix type display.

Figure 6B:
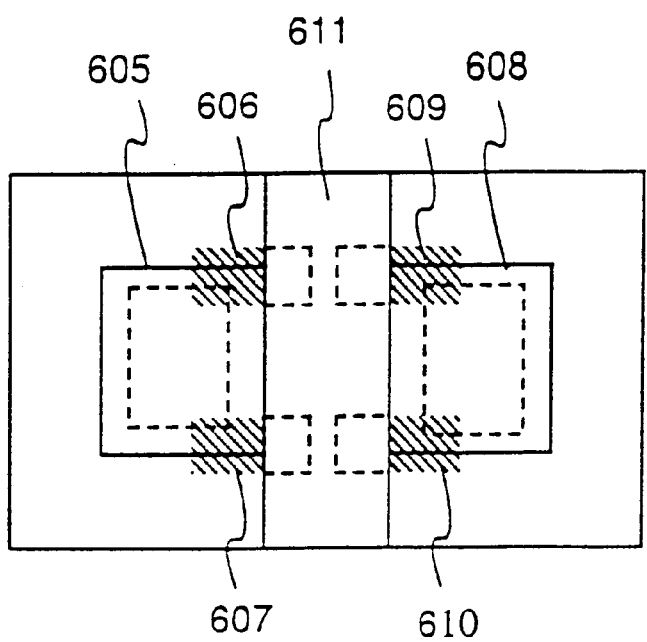

In such a case, a structure as shown in FIG. 6B may be adopted. In FIG. 6B, pinning regions 606 and 607 are connected electrically with a source electrode (or a drain electrode) not shown in a source region (or a drain region) 605. Further, pinning regions 609 and 610 are connected electrically with a drain electrode (or a source electrode) not shown in a drain region (or a source region) 608.

At this time, the pinning region 606 (or 607) is separated from the pinning region 609 (or 610) under a gate electrode 611 because the device does not function as a transistor when they are electrically connected. It is noted that it is effective to add the structure as shown in FIG. 6A to the structure of FIG. 6B.

The present embodiment is only an example and the structure of the device is not confined only to the structure described above as a matter of course. That is, the shape of the pinning regions and the disposition of the contact hole for the source electrode may be designed within a discretion of a person who carries out the invention as long as the structure allows the minority carriers flowing through the pinning regions to be drawn out effectively.

[Seventh Embodiment]

Another structural example of the impurity region for controlling the threshold voltage in the P-channel type pinning FET shown in the second embodiment will be shown in the present embodiment. It is noted that while an explanation will be made below with reference to FIGS. 7A and 7B, only necessary parts will be denoted by reference numerals and be explained because the basic structure has been explained in detail with reference to FIG. 2.

Figure 7A:
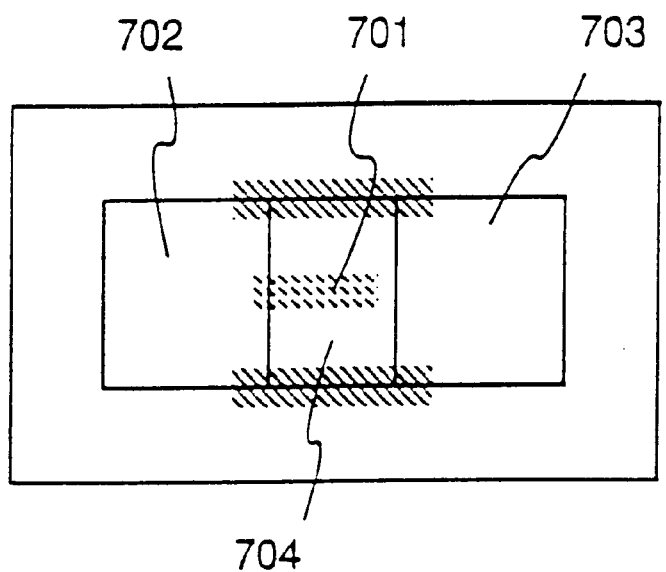
FIGS. 7A and 7B are diagrams showing shapes of impurity regions for controlling a threshold value.

FIG. 7A shows a structure in which an impurity region 701 for controlling the threshold voltage is formed in a body with a source region 702 and separately from a drain region 703. In this case, a region 704 turns out to be a channel forming region.

Figure 7B:
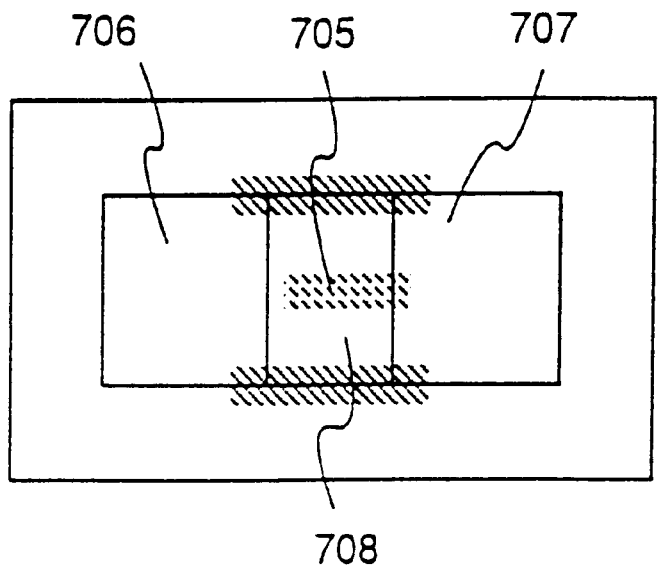

FIG. 7B shows a structure in which an impurity region 705 for controlling the threshold voltage is formed separately from a source region 706 and in a body with a drain region 707. In this case, a region 708 turns out to be a channel forming region.

[Eighth Embodiment]

A case of doping the same impurity element with the impurity region for pinning to the insulating layer (buried oxide film) which is the underlying layer of the mono-crystal silicon layer in the semiconductor devices shown in the first, second and fifth embodiments will be explained in the present embodiment.

It is noted that the N-channel type pinning FET will be exemplified and the case of using boron (or indium) as the above-mentioned impurity element will be shown in the present embodiment. It is needless to say that phosphorus, arsenic or antimony may be doped in case of the P-channel type pinning FET.

FIGS. 8A and 8B are section views of the semiconductor device of the present embodiment in which the channel forming region is focused in particular. FIGS. 8A and 8B correspond to sections of the channel forming regions taken along the channel width direction. However, a gate insulating film, a gate electrode and others are omitted here.

As shown in FIG. 8A, the device comprises a mono-crystal silicon substrate 801, a buried oxide film 802, the channel forming region 803 and pinning regions 804 and 805. The present embodiment is characterized in that a region 806 to which boron has been doped is formed in the vicinity of the surface of the buried oxide film 802 at this time.

The structure shown in FIG. 8B is basically the same with the structure shown in FIG. 8A except of that boron is doped to the whole buried oxide film 802.

It is noted that while boron is used in the present embodiment because the N-channel type pinning FET is exemplified, the impurity element (element in the XIII group) which shifts the energy band in the direction of impeding the move of electrons may be used as shown in the first embodiment.

The impurity element (element in the XV group) which shifts the energy band in the direction of impeding the move of positive holes may be used as shown in the second embodiment when the device is the P-channel type pinning FET.

FIG. 8C is a diagrammatic view of the energy state of the channel forming region constructed as shown in FIG. 8A. In FIG. 8C, a region 808 is a region where the energy barrier is low and which functions as the channel forming region.

Further, a high energy barrier region 809 caused by exudation of the impurity element is formed in the vicinity of the pinning regions 804 and 805 and the buried oxide film 802 to which boron has been doped intentionally.

FIGS. 8D and 8E are charts showing a distribution of energy of the channel forming region. FIG. 8D shows the distribution of energy along a dotted line X in FIG. 8C, wherein the horizontal axis represents a distance in the channel width direction and the vertical axis represents relative energy. FIG. 8E shows the distribution of energy along a dotted line Y in FIG. 8C, wherein the horizontal axis represents the relative energy and the vertical axis represents a distance in the depth direction.

It is noted that the energy distribution charts of FIGS. 8D and 8E are drawn so as to correspond to the energy state chart of FIG. 8C.

As shown in FIG. 8D, the relative energy is large corresponding to b in the pinning region and in the vicinity thereof. However, the relative energy is minimized (corresponding to a) within the region 808 where the carriers move (the part farthest from the pinning region in particular).

Further, as shown in FIG. 8E, the distribution of energy along the dotted line Y shows the relative energy which is high by a certain degree in the vicinity of a gate insulating film (not shown) and which is minimized corresponding to a within the region 811 where the carriers 810 move. Then, the relative energy increases gradually as it approaches to the interface with the buried oxide film 802 and becomes the energy corresponding to b'.

It is noted that b=b' when the concentration of impurity doped to the pinning region is equal to the concentration of impurity doped to the buried oxide film. b and b' are different when the doping concentration is different as a matter of course. Either one may be adopted in the present invention.

In case of the present invention, the relative energy (b or b') is preferable to be three times or more (or more preferably ten times or more) of the relative energy (a). It allows to obtain the structure in which the carriers (electrons or positive holes) move preferentially through the region 808 where the energy state is low.

Further, because the high energy barrier is formed around the interface between the channel forming region 803 and the buried oxide film 802 and the carriers cannot come close to that, it is possible to prevent scattering of carriers which otherwise occurs in the vicinity of the surface of the underlying layer (the buried oxide film).

[Ninth Embodiment]

While the case of insulating the mono-crystal silicon layer by the field oxide film using the LOCOS method has been shown in the semiconductor devices shown in the first, second and fifth embodiments, means other than the LOCOS method may be adopted as a device separating technique in the present invention.

Figure 9A:
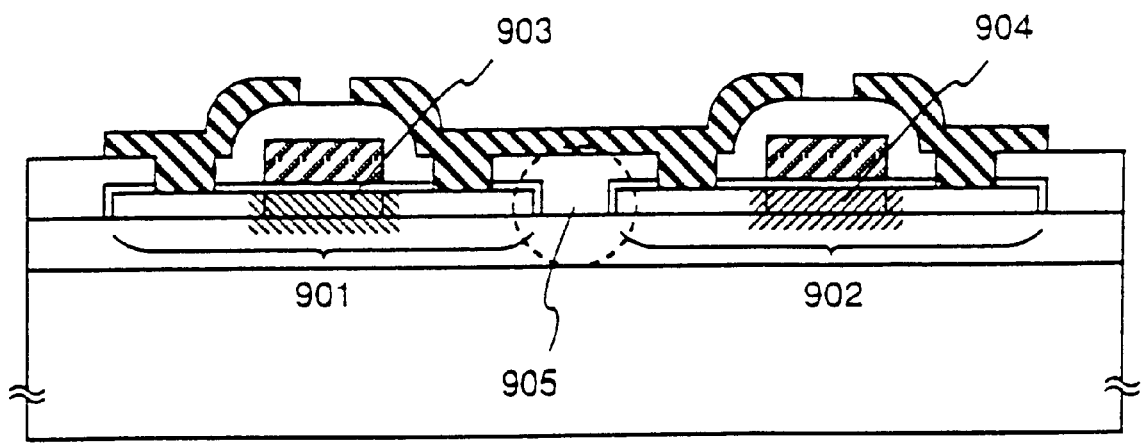
FIGS. 9A and 9B diagrams showing structures of CMOS semiconductor devices.

FIG. 9A shows a case when an active region is formed by patterning a mono-crystal silicon layer into the shape of island in the CMOS semiconductor device shown in the fifth embodiment. Because each component has been already explained in detail in the fifth embodiment, their explanation will be omitted here.

As shown in FIG. 9A, the semiconductor device comprises an island semiconductor layer 901 which turns out to be an active region of an N-channel type pinning FET and an island semiconductor layer 902 which turns out to be an active region of a P-channel type pinning FET. Pinning regions 903 (P-type conductivity) and 904 (N-type conductivity) are provided in the respective semiconductor layers.

The structure shown in FIG. 9A is characterized in that the N-channel type pinning FET and the P-channel type pinning FET are completely divided by patterning as indicated by the reference numeral 905. This kind of structure is called a mesa structure. This structure allows a leak current to be reduced because it allows the devices to be completely separated.

Figure 9B:
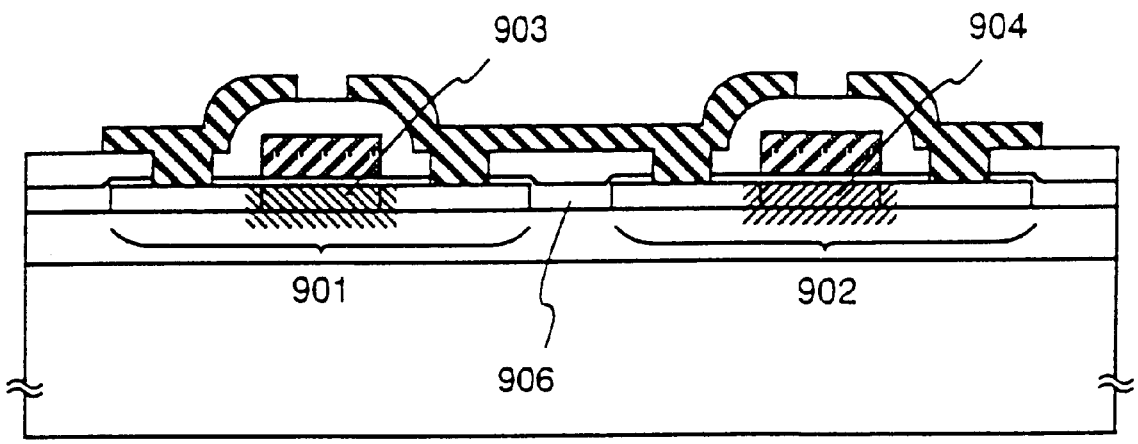

A structure shown in FIG. 9B is the same with the structure shown in FIG. 9A in that a semiconductor layer formed into the shape of island by patterning is used as an active region. The difference between the structures shown in FIGS. 9B and 9A is that a buried insulating film 906 is formed so as to surround the island semiconductor layer.

After forming the island semiconductor layer, an insulating film whose main component is silicon is formed so as to coat the layer. Then, the insulating film is retarded by means of etching back or CMP (chemical-mechanical polishing) to bury the irregualarity formed by the island semiconductor layer. It then allows to enhance the flatness of electrodes and others to be formed above the active region.

The structure of the present embodiment may be applied also to the singular semiconductor device shown in the first and second embodiments as a matter of course. Further, the effect of the present invention is not lost even when a device separating method other than the device separating method shown in the present embodiment is used.

[Tenth Embodiment]

The present invention is applicable to the conventional IC technologies in general. That is, it is applicable to all semiconductor devices (products containing the SOIFET as parts thereof) circulated presently in the market. It is noted that the "semiconductor device" mentioned in the present specification includes in its category not only singular devices but also integrated circuits composed of a plurality of singular devices and electro-optical devices (applied products) carrying such integrated circuits.

For instance, the present invention is applicable to microprocessors such as an RISC processor and an ASIC processor integrated on one chip. The present invention is also applicable to all kinds of integrated circuits utilizing semiconductor from a signal processing circuit such as a D/A converter to a high-frequency circuit for portable equipments (portable telephone, PHS, mobile computer and the like).

Figure 10:
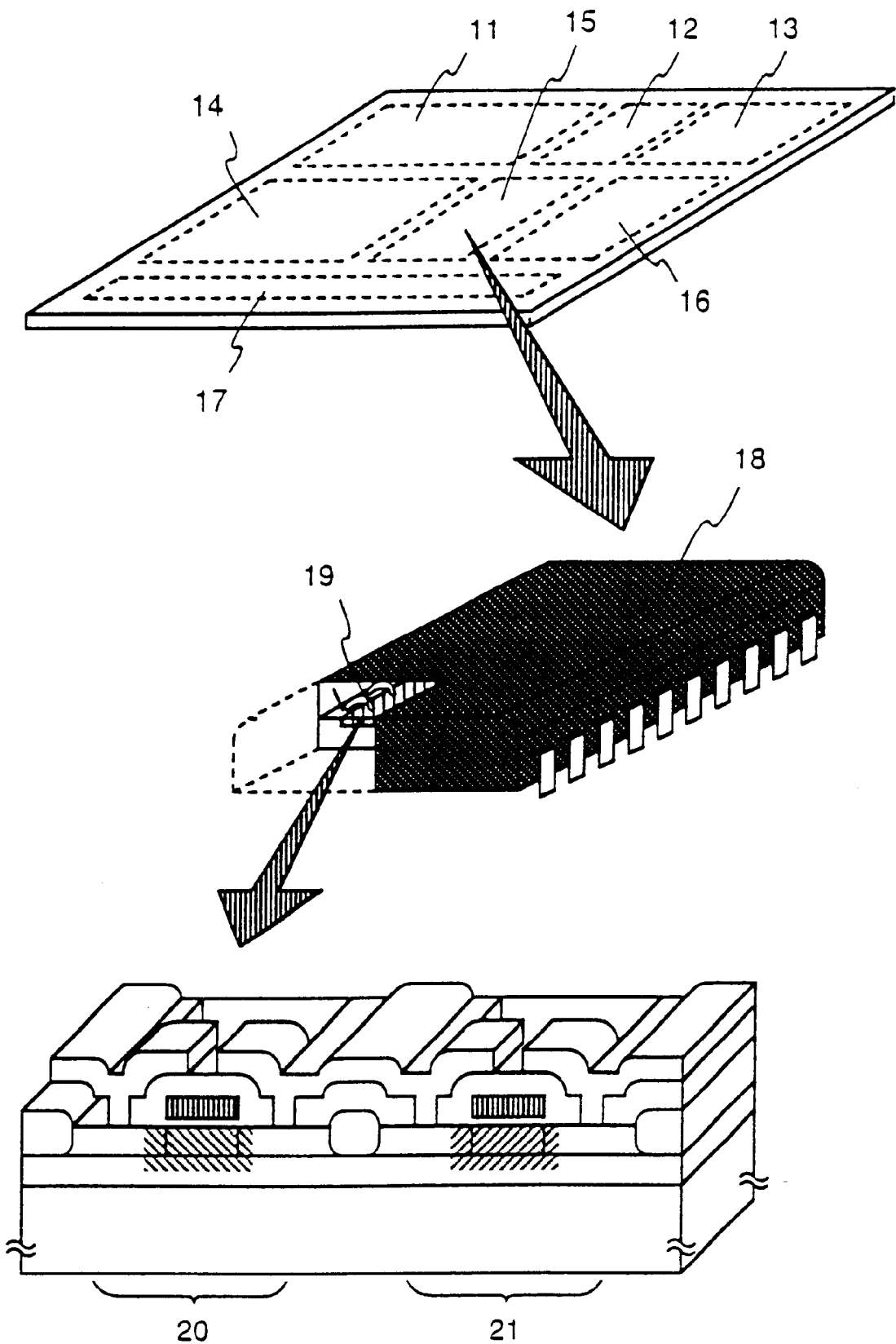
FIG. 10 shows an applied example of the semiconductor device.

FIG. 10 shows one example of a microprocessor. The microprocessor comprises, typically, a CPU core 11, a RAM 12, a clock controller 13, a cache memory 14, a cache controller 15, a serial interface 16, an I/O port 17 and others.

The microprocessor shown in FIG. 10 is a simplified example as a matter of course and a great variety of circuits are designed in actual microprocessors according its use.

However, no matter what kinds of function the microprocessors have, what functions as a nucleus is an IC (Integrated Circuit) 18. The IC 18 is a functional circuit in which integrated circuits formed on a semiconductor chip 19 is protected by ceramic or the like.

Then, what compose the integrated circuits formed on the semiconductor chip 19 are pinning FETs 20 (N-channel type) and 21 (P-channel type) of the invention. It is noted that the basic circuit is often constructed in the minimum unit of CMOS.

The microprocessor shown in the present embodiment is mounted in various electro-optical equipments to function as a nucleus circuit. The typical electro-optical equipments include personal computers, portable information terminal units and all kinds of home appliances.

[Eleventh Embodiment]

The inventive pinning FETs shown in the first through eighth embodiments may be used for composing not only the semiconductor device shown in the tenth embodiment but also reflection type electro-optical equipments.

For instance, it is possible to fabricate an active matrix type liquid crystal module by integrating semiconductor circuits including an operation circuits, signal processing circuits, shift register circuits, pixel matrix circuits and the like on one substrate by the inventive pinning FETs.

It may be also used in composing image sensors, EL displays, EC displays and the like, beside the liquid crystal module.

It is also possible to construct electro-optical equipments mounting a display media such as the above-mentioned liquid crystal module as a display. Such electro-optical equipments include video cameras, still cameras, projectors, head-mounted displays, car navigators, personal computers, portable information terminal units (mobile computer, portable telephone, etc.) and the like. FIGS. 11A through 11F show examples thereof.

Figure 11A:
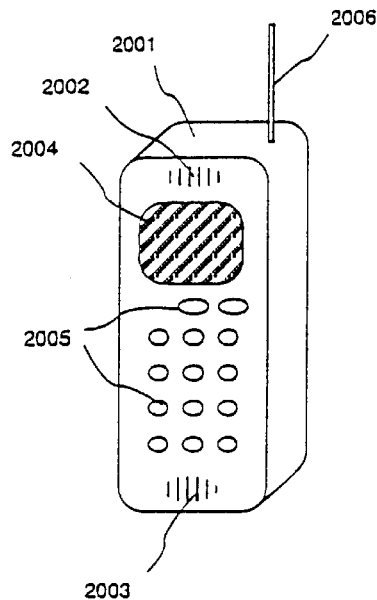
FIGS. 11A through 11F show examples of electro-optical equipments.

FIG. 11A shows a portable telephone comprising a main body 2001, a voice output section 2002, a voice input section 2003, a display 2004, control switches 2005 and an antenna 2006. The present invention is applicable to the voice output section 2002, the voice input section 2003, the display 2004 and the like.

Figure 11B:
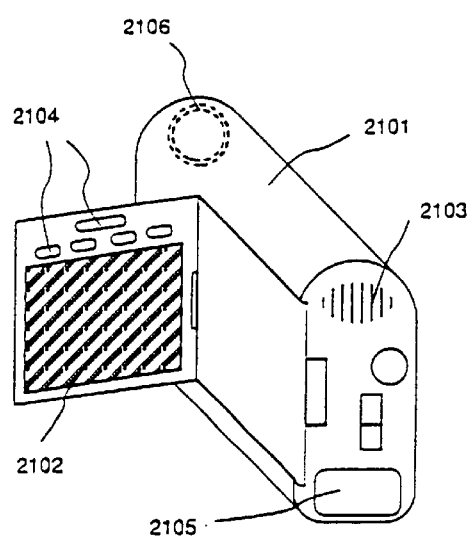

FIG. 11B shows a video camera comprising a main body 2101, a display 2102, a voice input section 2103, control switches 2104, a battery 2105 and an image receiving section 2106. The present invention is applicable to the display 2102, the voice input section 2103, the image receiving section 2106 and the like.

Figure 11C:
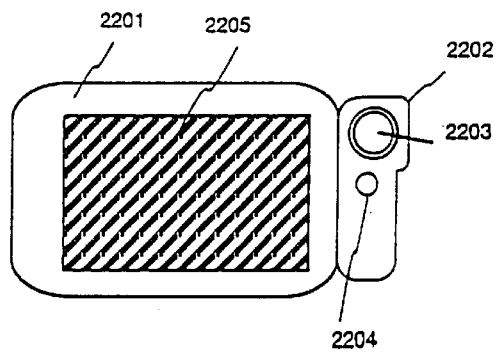

FIG. 11C shows a mobile computer comprising a main body 2201, a camera section 2202, an image receiving section 2203, a control switch 2204 and a display 2205. The present invention is applicable to the camera section 2202, the image receiving section 2203, the display 2205 and the like.

Figure 11D:
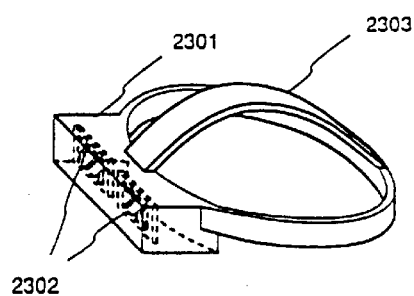

FIG. 11D shows a head-mounted display comprising a main body 2301, a display 2302 and a band section 2303. The present invention is applicable to the display 2302.

Figure 11E:
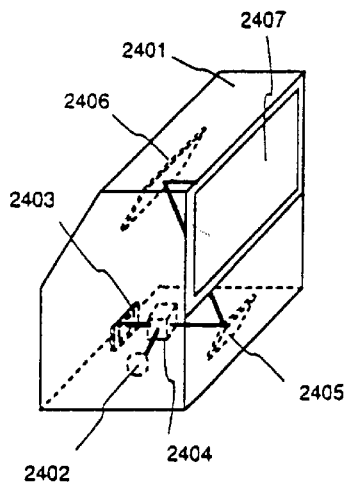

FIG. 11E shows a rear type projector comprising a main body 2401, a light source 2402, a display unit 2403, a polarizing beam splitter 2404, reflectors 2405 and 2406 and a screen 2407. The present invention is applicable to the display unit 2403.

Figure 11F:
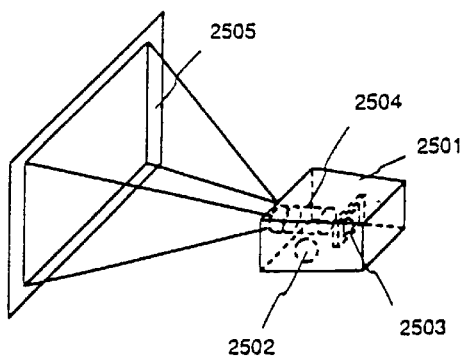

FIG. 11F shows a front type projector comprising a main body 2501, a light source 2502, a display unit 2503, an optical system 2504 and a screen 2505. The present invention is applicable to the display unit 2503.

As described above, the applicable range of the present invention is very wide and the present invention is applicable to electro-optical equipments in every fields. Further, because the inventive pinning FETs can compose semiconductor circuits such as IC and LSI as explained in the ninth embodiment, the present invention is applicable to all kinds of products which require such semiconductor circuits.

As described above, the present invention allows to suppress or prevent the adverse effects of the short-channel effect even in the submicron semiconductor devices whose channel length and channel width are very small. That is, it can solve the drop of the withstand voltage between the source and the drain and the drop of the threshold voltage caused by the punch-through phenomenon in the same time.

Further, because the above-mentioned effects can be obtained without doping extra impurity to the channel forming region (the region where carriers move), the mobility of the carriers is not hampered. As a result, reflecting the high mobility of mono-crystal silicon, the semiconductor device having a very high mobility can be realized.

Further, the present invention can solve the drop of the withstand voltage between the source and the drain which is otherwise caused by the impact ionization by actively using the pinning regions formed in the channel forming region as wires for drawing out the minority carriers.

The present invention allows the semiconductor device which realizes the very high mobility and the high reliability in the same time to be obtained by the synergetic effect of the above-mentioned effects.

The semiconductor device utilizing the present invention can replace all of the semiconductor devices (including applied products) circulated presently in the market and can enhance the performance and reliability of all of the semiconductor devices.

While the preferred embodiments have been described, variations thereto will occur to those skilled in the art within the scope of the present inventive concepts which are delineated by the following claims.

What is claimed is:

1. A semiconductor device comprising:
    a semiconductor film formed on an insulating surface, said semiconductor film having a source region, a drain region and a channel forming region;
    a gate electrode formed adjacent to said channel forming region with a gate insulating film interposed therebetween;
    a field oxide film surrounding said semiconductor film;
    a pair of first impurity regions formed at side edges of said channel forming region contacting with said field oxide film,
    a second impurity region formed in said semiconductor film,
    wherein said second impurity region is in contact with said channel forming region and one of said source and drain regions.

2. A semiconductor device according to claim 1, wherein said pair of first impurity regions shift an energy band of said channel forming region.

3. A semiconductor device according to claim 1, wherein said pair of first impurity regions are provided so as to be straddled said channel forming region and said field oxide film.

4. A semiconductor device according to claim 1, wherein said semiconductor device is incorporated into an electric equipment selected from the group consisting of a video camera, a still camera, a projector, a head mounted display, a car navigator, a personal computer, and a portable information terminal.

5. A semiconductor device comprising:
    a semiconductor film formed on an insulating surface, said semiconductor film having a source region, a drain region and a channel forming region;
    a gate electrode formed adjacent to said channel forming region with a gate insulating film interposed therebetween;

a field oxide film surrounding said semiconductor film;

a pair of first impurity regions formed at side edges of said channel forming region contacting with said field oxide film; and a second impurity region formed in said semiconductor film, wherein said pair of first impurity regions reach the inside of said source region and drain regions, wherein said second impurity region is in contact with said channel forming region and one of said source and drain regions.

6. A semiconductor device according to claim 5, wherein said pair of first impurity regions shift an energy band of said channel forming region.

7. A semiconductor device according to claim 5, wherein said pair of first impurity regions are provided so as to be straddled said channel forming region and said field oxide film.

8. A semiconductor device according to claim 5, wherein said semiconductor device is incorporated into an electric equipment selected from the group consisting of a video camera, a still camera, a projector, a head mounted display, a car navigator, a personal computer, and a portable information terminal.

9. A semiconductor device comprising:

a semiconductor film formed on an insulating surface, said semiconductor film having a source region, a drain region and a channel forming region;

a gate electrode formed adjacent to said channel forming region with a gate insulating film interposed therebetween;

a field oxide film surrounding said semiconductor film;

a pair of first impurity regions formed at side edges of said channel forming region contacting with said field oxide film; and a second impurity region formed in said semiconductor film, wherein said second impurity region is in contact with said channel forming region and one of said source and drain regions, wherein said source and drain regions contain an impurity imparting p-type conductivity.

10. A semiconductor device according to claim 9, wherein said pair of first impurity regions shift an energy band of said channel forming region.

11. A semiconductor device according to claim 9, wherein said pair of first impurity regions are provided so as to be straddled said channel forming region and said field oxide film.

12. A semiconductor device according to claim 9, wherein said semiconductor device is incorporated into an electric equipment selected from the group consisting of a video camera, a still camera, a projector, a head mounted display, a car navigator, a personal computer, and a portable information terminal.

13. A semiconductor device comprising:

a semiconductor film formed on an insulating surface, said semiconductor film having a source region, a drain region and a channel forming region;

a gate electrode formed adjacent to said channel forming region with a gate insulating film interposed therebetween;

a field oxide film surrounding said semiconductor film;

a pair of first impurity regions formed at side edges of said channel forming region contacting with said field oxide film; and a second impurity region formed in said semiconductor film, wherein said pair of said first impurity regions reach the inside of said source region and drain regions, wherein said second impurity region is in contact with said channel forming region and one of said source and drain regions, wherein said source and drain regions contain an impurity imparting p-type conductivity.

14. A semiconductor device according to claim 13, wherein said pair of first impurity regions shift an energy band of said channel forming region.

15. A semiconductor device according to claim 13, wherein said pair of first impurity regions are provided so as to be straddled said channel forming region and said field oxide film.

16. A semiconductor device according to claim 13, wherein said semiconductor device is incorporated into an electric equipment selected from the group consisting of a video camera, a still cameras, a projector, a head mounted display, a car navigator, a personal computer, and a portable information terminal.

17. A semiconductor device having at least one integrated circuit, said integrated circuit comprising:

an n-channel type field effect transistor and a p-channel type field effect transistor, each of said transistors having a semiconductor film formed on an insulating surface;

wherein said semiconductor film has a source region, a drain region and a channel forming region, wherein a gate electrode is formed adjacent to said channel forming region with a gate insulating film interposed therebetween, wherein a field oxide film is formed so as to surround said semiconductor film, and wherein a pair of impurity regions are formed at side edges of said channel forming region contacting with said field oxide film.

18. A semiconductor device according to claim 17, wherein said pair of impurity regions shift an energy band of said channel forming region.

19. A semiconductor device according to claim 17, wherein said pair of impurity regions are provided so as to be straddled said channel forming region and said field oxide film.

20. A semiconductor device according to claim 17, wherein said semiconductor device is incorporated into an electric equipment selected from the group consisting of a video camera, a still camera, a projector, a head mounted display, a car navigator, a personal computer, and a portable information terminal.

21. A semiconductor device having at least one integrated circuit, said integrated circuit comprising:

an n-channel type field effect transistor and a p-channel type field effect transistor, each of said transistors having a semiconductor film formed on an insulating surface;

wherein said semiconductor film has a source region, a drain region and a channel forming region, wherein a gate electrode is formed adjacent to said channel forming region with a gate insulating film interposed therebetween, wherein a field oxide film is formed so as to surround said semiconductor film, wherein a pair of impurity regions are formed at side edges of said channel forming region contacting with said field oxide film, and wherein said pair of impurity regions reach the inside of said source region and drain regions.

22. A semiconductor device according to claim 21, wherein said pair of impurity regions shift an energy band of said channel forming region.

23. A semiconductor device according to claim 21, wherein said pair of impurity regions are provided so as to be straddled said channel forming region and said field oxide film.

24. A semiconductor device according to claim 21, wherein said semiconductor device is incorporated into an electric equipment selected from the group consisting of a video camera, a still camera, a projector, a head mounted display, a car navigator, a personal computer, and a portable information terminal.

* * * * *